United States Patent
Fujii et al.

(10) Patent No.: US 9,679,743 B2
(45) Date of Patent: Jun. 13, 2017

(54) SAMPLE PROCESSING EVALUATION APPARATUS

(71) Applicant: HITACHI HIGH-TECH SCIENCE CORPORATION, Minato-ku, Tokyo (JP)

(72) Inventors: Toshiaki Fujii, Tokyo (JP); Hiroyuki Suzuki, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 0 days.

(21) Appl. No.: 15/048,073

(22) Filed: Feb. 19, 2016

(65) Prior Publication Data

US 2016/0247662 A1    Aug. 25, 2016

(30) Foreign Application Priority Data

Feb. 23, 2015  (JP) .................. 2015-033394
Feb. 17, 2016  (JP) .................. 2016-028291

(51) Int. Cl.
| | | |
|---|---|---|
| H01J 37/02 | (2006.01) |
| H01J 37/20 | (2006.01) |
| H01J 37/22 | (2006.01) |
| H01J 37/305 | (2006.01) |
| H01J 37/285 | (2006.01) |

(52) U.S. Cl.
CPC .......... *H01J 37/222* (2013.01); *H01J 37/285* (2013.01); *H01J 37/305* (2013.01); *H01J 2237/2001* (2013.01); *H01J 2237/221* (2013.01)

(58) Field of Classification Search
CPC ................ H01J 37/20; H01J 37/023

USPC .............. 250/442.11, 310, 440.11
See application file for complete search history.

(56) References Cited

U.S. PATENT DOCUMENTS

| | | | | |
|---|---|---|---|---|
| 3,005,098 A * | 10/1961 | Buschmann | ...... | G01N 23/2252 250/310 |
| 4,020,353 A * | 4/1977 | Saito | ...... | H01J 37/20 250/441.11 |
| 4,891,526 A * | 1/1990 | Reeds | ...... | G03F 7/70716 250/442.11 |
| 5,223,109 A * | 6/1993 | Itoh | ...... | H01J 37/3056 204/192.34 |
| 6,403,968 B1 * | 6/2002 | Hazaki | ...... | H01J 37/20 250/442.11 |
| 6,417,512 B1 * | 7/2002 | Suzuki | ...... | G01N 1/32 250/307 |
| 8,754,384 B1 * | 6/2014 | Persoon | ...... | H01J 37/20 250/306 |
| 9,129,773 B2 * | 9/2015 | Ando | ...... | H01J 37/244 |
| 9,202,671 B2 * | 12/2015 | Man | ...... | H01J 37/3002 |
| 9,384,941 B2 * | 7/2016 | Man | ...... | H01J 37/20 |

(Continued)

FOREIGN PATENT DOCUMENTS

| | | |
|---|---|---|
| JP | 4135079 | 5/1992 |
| JP | 2008039521 | 2/2008 |
| JP | 2008191120 | 8/2008 |

*Primary Examiner* — David A Vanore
(74) *Attorney, Agent, or Firm* — Adams & Wilks

(57) ABSTRACT

A sample processing evaluation apparatus includes a charged particle beam column that irradiates a sample with charged particle beam, a sample holder that holds both ends of the sample, and a sample stage on which the sample holder is placed, in which the sample holder is configured to rotate the sample about a rotation axis between the sample stage and the charged particle beam column.

18 Claims, 23 Drawing Sheets

(56) References Cited

U.S. PATENT DOCUMENTS

| | | | | |
|---|---|---|---|---|
| 2002/0005492 A1* | 1/2002 | Hashikawa | H01J 37/20 | 250/442.11 |
| 2007/0125958 A1* | 6/2007 | Tappel | H01J 37/20 | 250/441.11 |
| 2008/0073586 A1* | 3/2008 | Iwasaki | G01N 23/2251 | 250/492.21 |
| 2008/0202920 A1* | 8/2008 | Iwaya | G01N 1/32 | 204/192.34 |
| 2008/0224198 A1* | 9/2008 | Fujii | H01J 37/3056 | 257/307 |
| 2009/0114842 A1* | 5/2009 | Takahashi | H01J 37/023 | 250/442.11 |
| 2011/0017922 A1* | 1/2011 | Amador | H01J 37/20 | 250/442.11 |
| 2011/0253905 A1* | 10/2011 | Moebus | G21K 7/00 | 250/441.11 |
| 2012/0112063 A1* | 5/2012 | Schertel | G01N 1/32 | 250/307 |
| 2012/0298884 A1* | 11/2012 | Nakajima | H01J 37/20 | 250/453.11 |
| 2013/0075606 A1* | 3/2013 | Uemoto | H01J 37/261 | 250/310 |
| 2014/0061159 A1* | 3/2014 | Asahata | H01J 37/3005 | 216/85 |
| 2014/0353151 A1* | 12/2014 | Kaneko | H01J 37/3053 | 204/298.36 |
| 2015/0008121 A1* | 1/2015 | Kamino | G01N 1/32 | 204/298.36 |
| 2016/0093464 A1* | 3/2016 | Suzuki | H01J 37/20 | 250/442.11 |
| 2016/0247662 A1* | 8/2016 | Fujii | H01J 37/222 | |

* cited by examiner

FIG. 7A
FIG. 7B
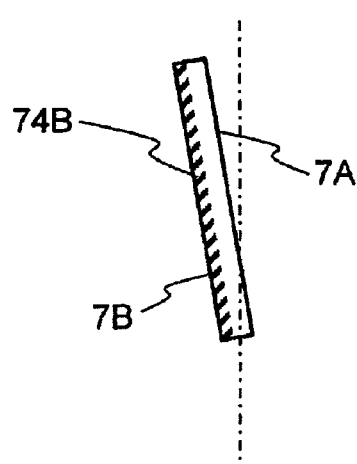
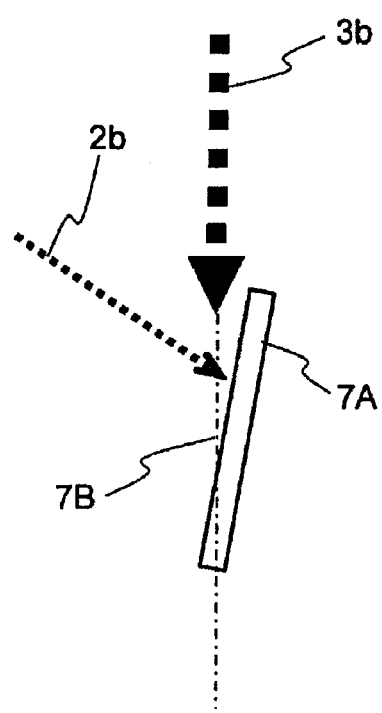

FIG. 8A
FIG. 8B
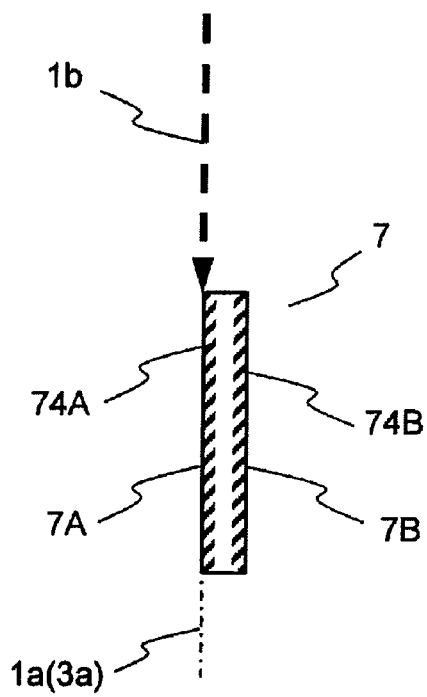
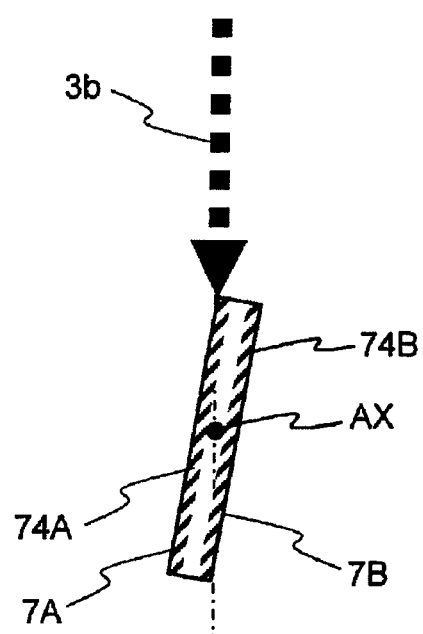

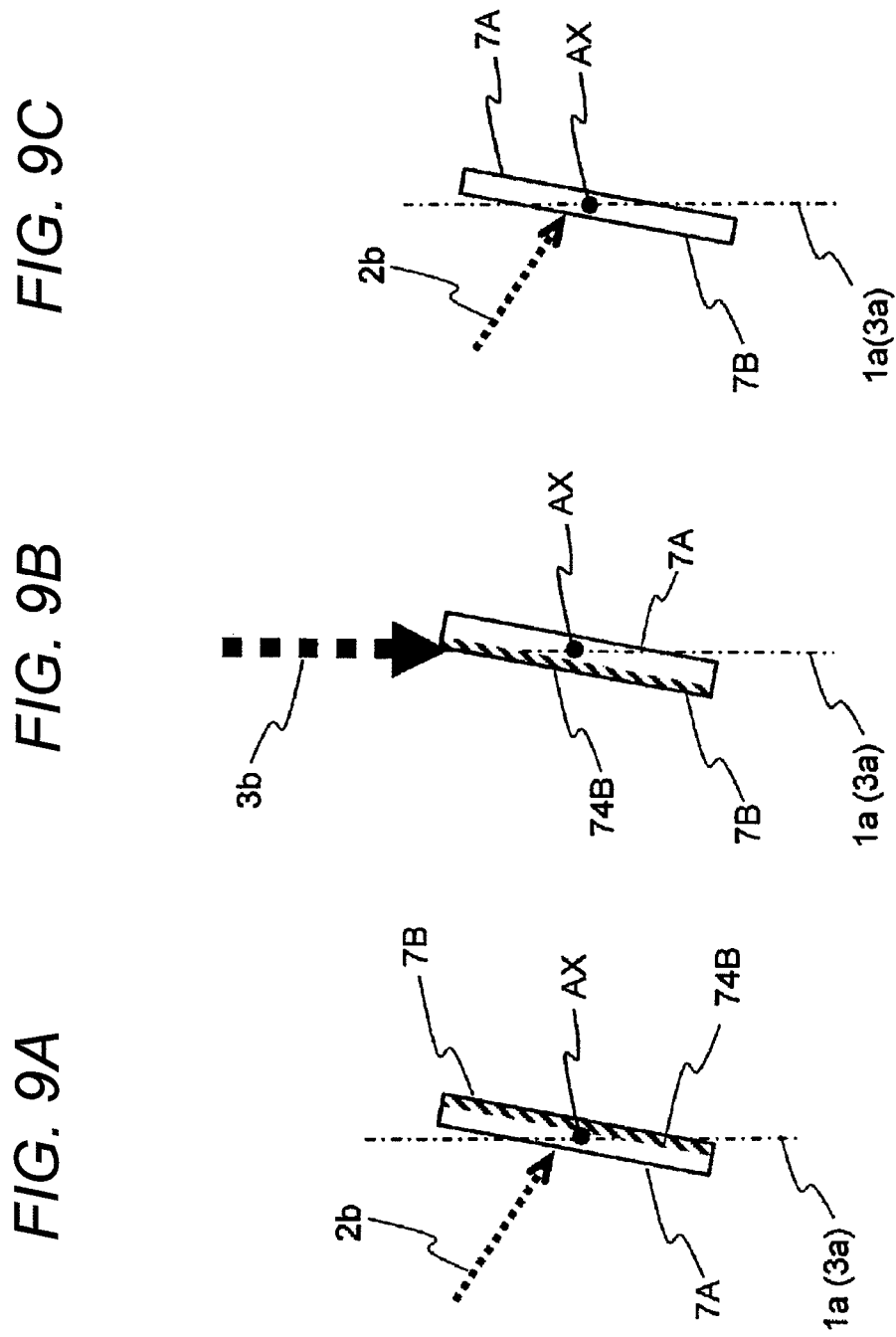

FIG. 14A
FIG. 14B
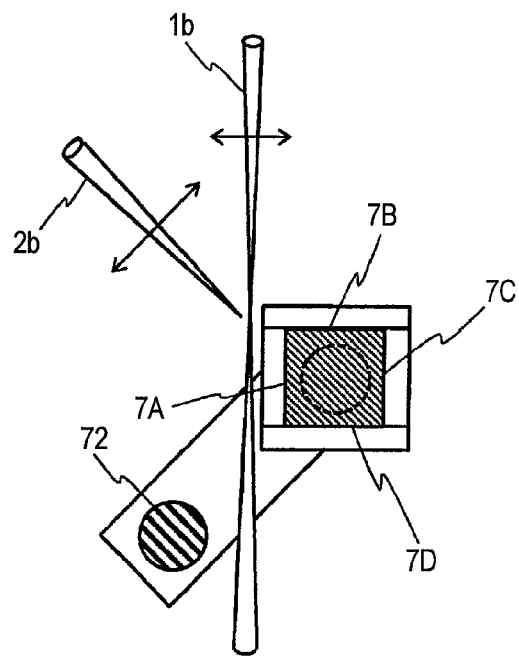
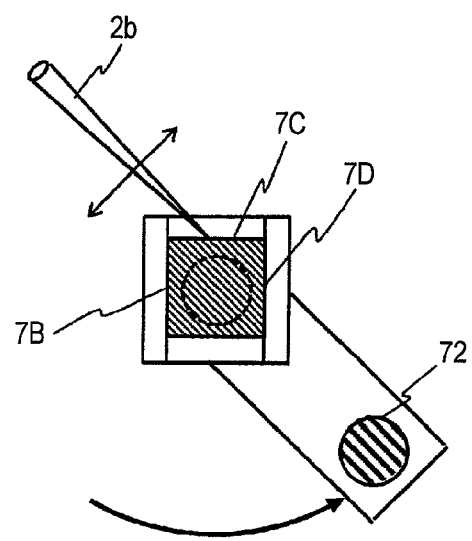
FIG. 14C
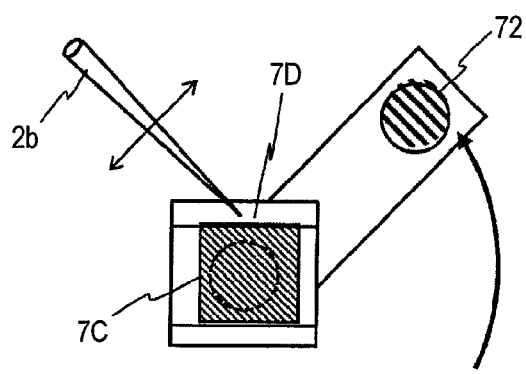

FIG. 15A
FIG. 15B
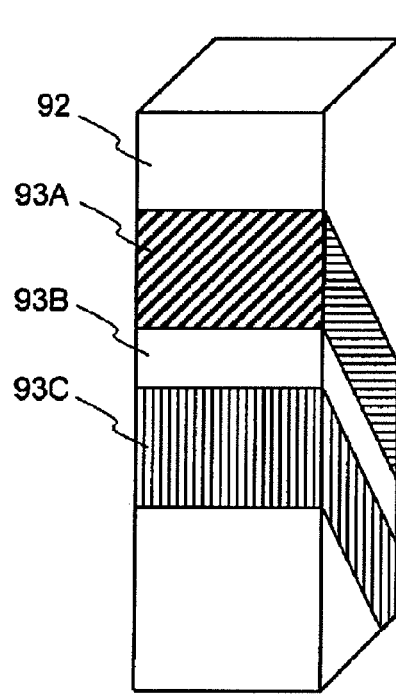
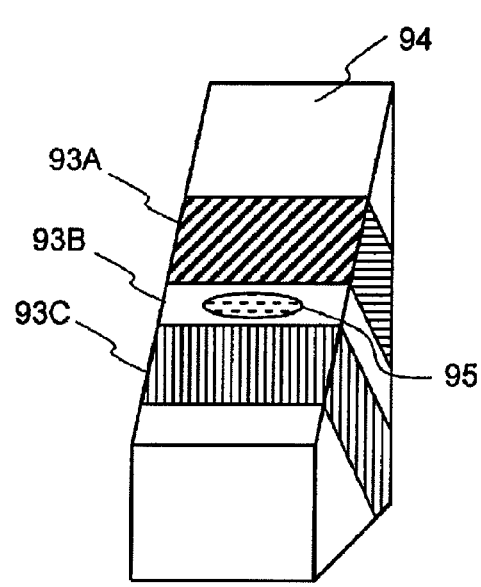

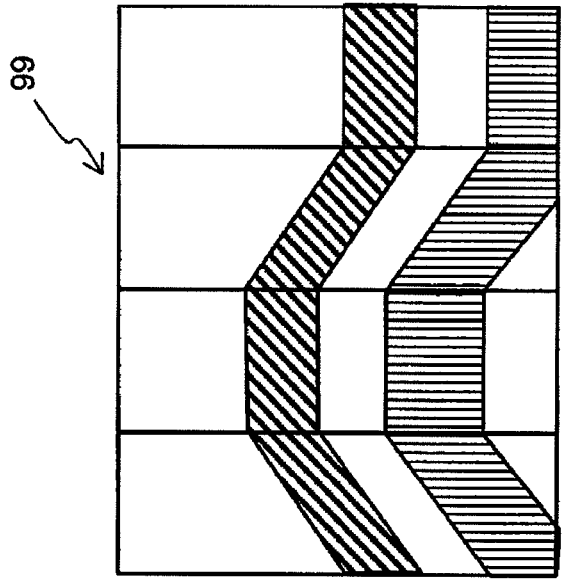
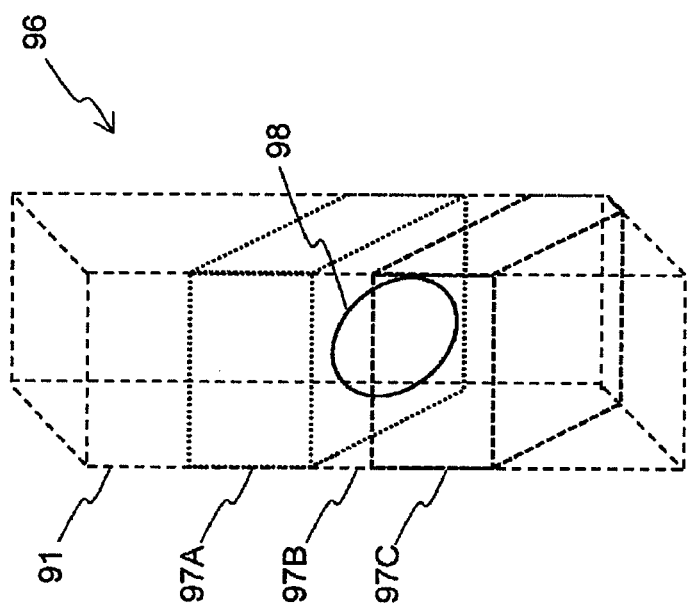
FIG. 16A
FIG. 16B

SAMPLE PROCESSING EVALUATION APPARATUS

CROSS-REFERENCE TO RELATED APPLICATIONS

This application claims priority from Japanese Patent Application No. 2015-033394 filed on Feb. 23, 2015 and Japanese Patent Application No. 2016-028291 filed on Feb. 17, 2016, the entire subject-matters of which are incorporated herein by reference.

TECHNICAL FIELD

The disclosure relates to a sample processing evaluation apparatus that produces a sample with an ion beam and evaluates the sample.

BACKGROUND

In recent years, technologies for producing minute structures have been developed, and also, it has been required to evaluate shapes and mechanical properties of the produced minute structures on site.

In the related art, usage of a focused ion beam (hereinafter, referred to as an FIB) to process minute samples in a level of micro meters ($\mu$m) is known. There is a method in which a sample is cut by the FIB, a sample stage with the sample placed thereon is rotated, and a cut surface is observed with a scanning electron microscope (hereinafter, referred to as an SEM) with the sample on the sample stand (see JP-A-2008-039521). In addition, an ion beam processing apparatus capable of processing minute rotating bodies with the FIB is known (see JP-A-2008-191120).

Evaluation of properties described in this specification means evaluation of mechanical properties such as bending, torsion, compression, heating and cooling, and fatigue. As an apparatus for evaluating a tension property of a minute sample, an apparatus that accurately measures local stress and distortion by installing a small sample in a sample chamber of an SEM and performing SEM observation on the minute sample while applying tension force to the sample to detect variations in shapes of crystal particles that form the minute sample has been disclosed (see JP-A-H04-135079).

In a case in which an evaluation target is a silicon semiconductor device, for example, an element as a focused portion is typically formed in the vicinity of one surface of a silicon substrate in many cases. Therefore, the object of evaluating configurations of the focused portion can be achieved by processing and observing only one surface of the evaluation target. However, in a case of a natural product, such as a mineral, or an artificial structure in which focused portions are dispersed in the entire target, the focused portions do not necessarily gather on one surface, and it is desirable to process and observe the entire outer periphery of the target. However, it is difficult to realize such processing and observation by the techniques in the related art disclosed in JP-A-2008-039521, for example.

Although tension evaluation is one of the most important items of mechanical evaluation, other properties such as torsion, bending, and compression are also as important items of the evaluation as the tension, and these properties also require evaluation. However, it is difficult to realize the evaluation by the technique disclosed in JP-A-2008-191120.

A description will be given of how important it is to evaluate bending of a sample, as an example of evaluation of another property. Generally, it is considered that mechanical properties of a large member in a level of several tens of mm do not coincide with mechanical properties of a member in a level of $\mu$m even though the members are made of the same material, and it is considered that properties unique to the small sample appear. For example, a prism of silicon single crystal in a level of mm (for example, a quadrangular prism with a size of 5 mm×5 mm×100 mm) is significantly brittle. If a so-called three-point bending test in which a vertical load is applied to both ends and the center is conducted thereon, the sample breaks in a brittle manner almost without bending. However, a small quadrangular prism of the same silicon single crystal with a size of 5×$\mu$m×5 $\mu$m×100 $\mu$m, for example, exhibits an elastic characteristic. In recent years, minute structures in a level of $\mu$m, such as components of microelectromechanical systems (MEMSs), have been produced as described above. However, sufficient mechanical evaluation of such small samples has not been conducted under the current situations. From such a viewpoint, JP-A-2008-191120 does not describe that it is possible to evaluate mechanical properties other than the tension property.

In a case in which an evaluation target sample has an elongated prism shape with a cross section of 5 $\mu$m×5 $\mu$m and a length of several mm, for example, there is a high risk that the sample is damaged while producing the sample outside the evaluation apparatus and mounting the sample on the evaluation apparatus. In addition, there is also a risk that the production of the sample outside the evaluation apparatus causes variations in mechanical properties due to chemical transformation such as deformation and oxidation. Thus, it is advantageous to produce a sample with a diameter of approximately 1 mm, which can be handled with human hands, in advance, to install the sample on an evaluation apparatus, to process the sample into a small sample for property evaluation inside the evaluation apparatus, and to evaluate the small sample there. From this viewpoint, JP-A-2008-191120 includes a description about evaluation of a tension property of a sample inside an SEM. However, JP-A-2008-191120 does not disclose a technique of producing a sample within the same evaluation apparatus and evaluating the sample there.

Furthermore, JP-A-H04-135079 includes a description about FIB processing in a cantilevered state as means for processing a material into a sample. However, JP-A-H04-135079 does not disclose a technique of evaluating configurations and properties of the outer periphery of the processing target.

SUMMARY

One illustrative aspect of the disclosure provides a sample processing evaluation apparatus capable of processing a sample and easily evaluating configurations of the sample in multiple directions within the apparatus.

Another illustrative aspect of the disclosure provides a sample processing evaluation apparatus capable of processing a sample and evaluating properties of the sample within the apparatus.

According to some aspects of the disclosure, there is provided a sample processing evaluation apparatus as described below in order to solve the aforementioned problems.

In one illustrative aspect, there may be provided a sample processing evaluation apparatus comprising: a charged particle beam column configured to irradiate at least a sample with a charged particle beam; a sample holder configured to hold both ends of the sample; and a sample stage on which the sample holder is placed, wherein the sample holder is located between the sample stage and the charged particle beam column and is configured to rotate the sample about a rotation axis.

In one illustrative aspect, there may be provided a sample processing evaluation apparatus comprising: a focused ion beam column configured to irradiate a sample with a focused ion beam; an electron beam column configured to irradiate the sample with an electron beam coincide with an irradiation position on the sample with the focused ion beam; a sample holder configured to hold both ends of the sample; and a sample stage on which the sample holder is placed, wherein the sample holder is located between the sample stage and the focused ion beam column and is configured to rotate the sample about a rotation axis, the rotation axis being vertical to a plane formed by a focused ion beam irradiation axis of the focused ion beam column and an electron beam irradiation axis of the electron beam column.

In one illustrative aspect, the sample holder may be configured to rotate the sample by 360° about the rotation axis.

In one illustrative aspect, the rotation axis may be set so as to be substantially parallel with a surface, on which the sample holder is placed, of the sample stage.

In one illustrative aspect, the sample holder may comprise: a base that is arranged so as to be attachable to and detachable from the sample stage; a rotation shaft that is held by the base in a rotatable manner and is parallel with the rotation axis; and a holding unit fixed to the rotation shaft and is configured to directly hold the sample.

In one illustrative aspect, the sample processing evaluation apparatus may further comprise a gas ion beam column configured to irradiate a processed surface, which has been processed with the focused ion beam, with a gas ion beam for cleaning.

In one illustrative aspect, the sample processing evaluation apparatus may further comprise: an image formation unit configured to generate image data of the processed surface from an image signal that is obtained by irradiating the processed surface, which has been cleaned by being irradiated with the gas ion beam, with the electron beam; and a calculation processing unit that saves the image data formed by the image formation unit.

In one illustrative aspect, the image signal may be at least one of a secondary electron signal of secondary electrons, a reflected electron signals of reflected electrons, a fluorescent X-ray signal of a fluorescent X-ray, and a backscattered electron signal of backscattered electrons that are generated from the processed surface by being irradiated with at least one of the focused ion beam, the electron beam, and the gas ion beam.

In one illustrative aspect, the calculation processing unit may construct at least one of a stereoscopic image, a developed image, and a three-dimensional image of the sample by using a plurality of obtained image data items.

In one illustrative aspect, there may be provided a sample processing evaluation apparatus comprising: a charged particle beam column configured to irradiate a sample with a charged particle beam; a sample holder configured to fix the sample; and a sample stage on which the sample holder is placed, wherein the sample holder comprises a load applicator that is mounted on the sample holder between the sample stage and the charged particle beam column and is configured to apply a load to the sample.

In one illustrative aspect, the load may be at least one kind of torsion force, bending force, heating and cooling, and compression force.

In one illustrative aspect, the charged particle beam may be at least one of a focused ion beam, an electron beam, and a gas ion beam.

In one illustrative aspect, the sample holder may comprise: a base that is arranged so as to be attachable to and detachable from the sample stage; a rotation control unit that is arranged on the base; a holding unit configured to hold both ends of the sample; and a shaft that couples the rotation control unit and the holding unit, and the shaft may be rotated based on a control signal from the rotation control unit and rotates the sample that is held by the holding unit.

In one illustrative aspect, the holding unit may be provided with a heater configured to heat the sample.

According to the invention, it is possible to provide a sample processing evaluation apparatus capable of processing a sample and easily evaluating configurations of the sample in multiple directions within the apparatus. Alternatively, it is possible to provide a sample processing evaluation apparatus capable of processing a sample and evaluating properties of the sample in multiple directions within the apparatus.

BRIEF DESCRIPTION OF THE DRAWINGS

FIG. 4A is a diagram illustrating that a processed surface is formed on the sample, and FIG. 4B is a diagram illustrating an aspect in which the sample is rotated and the processed surface thereof is irradiated with an EB for observation;

FIGS. 7A and 7B are explanatory diagrams of the production procedure of the thin sample for TEM observation by the sample processing evaluation apparatus in the related art and illustrate stages following FIGS. 6A and 6B;

FIGS. 8A and 8B are explanatory diagrams of a production procedure of a thin sample for TEM observation by a sample processing evaluation apparatus according to an embodiment of the invention;

FIGS. 9A to 9C are explanatory diagrams of the production procedure of the thin sample for TEM observation by the sample processing evaluation apparatus according to the embodiment of the invention;

FIGS. 14A to 14C are explanatory sectional views of operations of the sample holder, where FIG. 14A is a diagram illustrating a relationship of a focused ion beam, a focused electron beam, and a clamp of the sample, FIG. 14B is a diagram illustrating a positional relationship when the sample holder is rotated about a rotation axis by 90° in a counterclockwise direction from FIG. 14A, and FIG. 14C illustrates a positional relationship when the sample holder is further rotated about the rotation axis by 90° in the counterclockwise direction from FIG. 14B;

FIGS. 15A and 15B are diagrams schematically illustrating a three-dimensional structure of a sample that is reconstructed from image information obtained by the sample processing evaluation apparatus according to the embodiment of the invention, where FIG. 15A illustrates a reconstructed stereoscopic image, and FIG. 15B illustrates a stereoscopic image when an oblique section of the reconstructed stereoscopic image is exposed;

FIGS. 16A and 16B are diagrams schematically illustrating the three-dimensional structure of the sample that is reconstructed from the image information obtained by the sample processing evaluation apparatus according to the embodiment of the invention, where FIG. 16A is a diagram schematically illustrating a reconstructed three-dimensional image, and FIG. 16B is a developed diagram of the sample;

DETAILED DESCRIPTION

Hereinafter, an illustrative embodiment of the disclosure will be described in detail with reference to the drawings.

Incidentally, evaluation of properties of a sample described in this specification means evaluation of mechanical properties such as bending, torsion, compression, heating and cooling, and fatigue, and a sample processing evaluation apparatus according to the invention is an apparatus capable of producing (processing) a sample for evaluation in the same apparatus and evaluating configurations and properties of the sample in multiple directions inside the same sample chamber.

In addition, the sample processing evaluation apparatus includes not only simple acquisition of property values but also microscope observation and analysis of the surface and the inside of the sample to be evaluated in a state in which a load is applied thereto.

First Embodiment

Hereinafter, a description will be given of an embodiment of a sample processing evaluation apparatus according to the invention.

Figure 1:
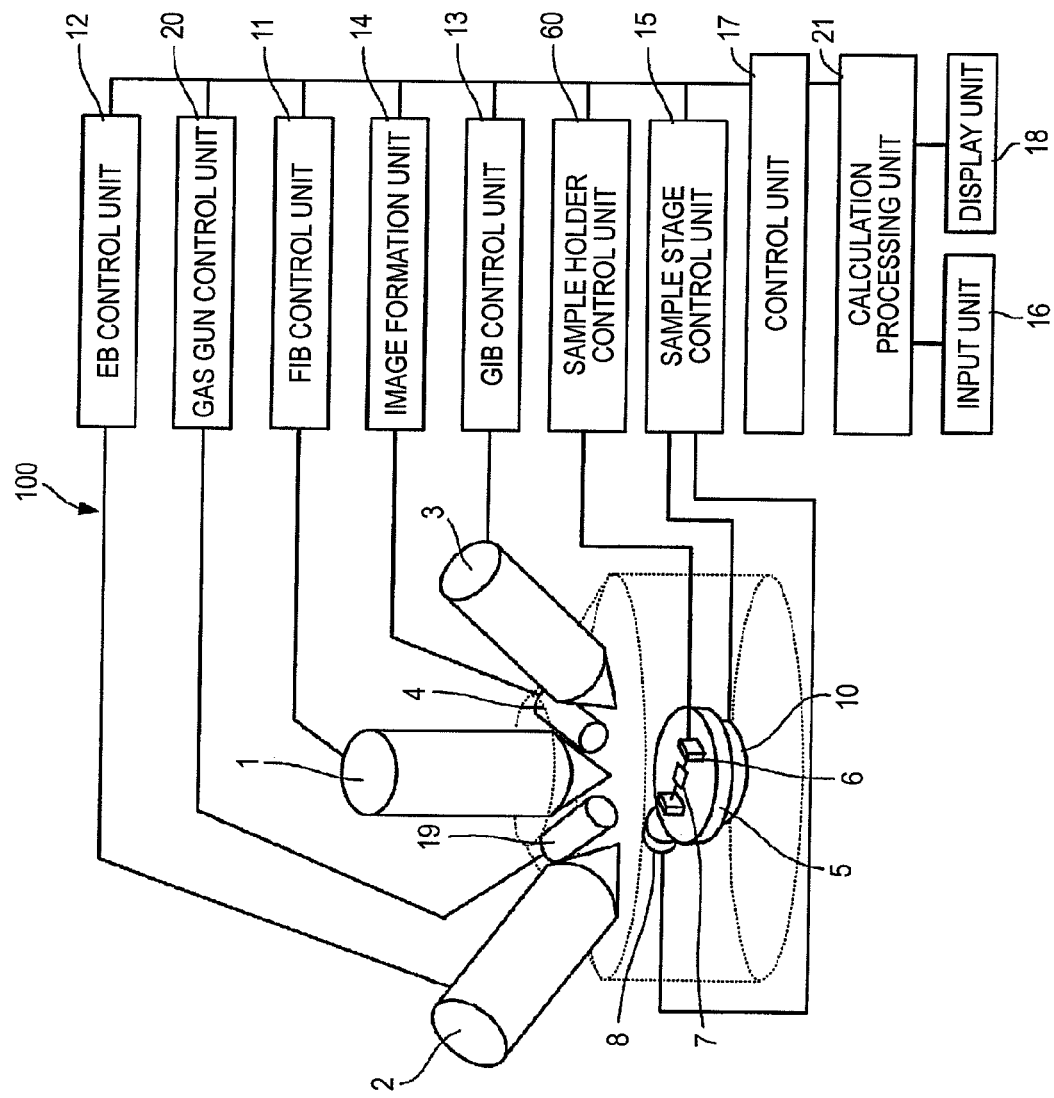
FIG. 1 is an overall configuration diagram of a sample processing evaluation apparatus according to an embodiment of the invention.

FIG. 1 illustrates an overall configuration of a sample processing evaluation apparatus 100 according to the embodiment. The sample processing evaluation apparatus 100 includes a focused ion beam column (FIB column) 1 that emits a focused ion beam (FIB) as a first charged particle beam, an electron beam column (EB column) 2 that emits an electron beam (EB) as a second charged particle beam, and a gas ion beam column (GIB column) 3 that emits a gas ion beam (GIB) as a third charged particle beam. Each of the FIB column 1, the EB column 2, and the GIB column 3 is understood as a charged particle beam column that emits a different charged particle beam.

The FIB column 1 includes a liquid metal ion source or a plasma ion source, can form a focused ion beam with a diameter of 100 nm or less, and can actively process a sample. The GIB column 3 includes a gas ion source of a PIG type, for example, and is used for the purpose of cleaning a surface, which has been processed with a focused ion beam, with an ion beam that is not focused as much as the focused ion beam from the FIB column 1. The GIB ion source uses helium, argon, xenon, oxygen, nitrogen, or the like as an ion source gas.

The sample processing evaluation apparatus 100 further includes a secondary electron detector 4 that detects a secondary electron signal of secondary electrons generated from a sample (sample piece) 7 due to irradiation with the EB, the FIB, or the GIB. The sample processing evaluation apparatus 100 may include a reflected electron detector that detects a reflection signal of reflected electrons generated from the sample 7 due to irradiation with the EB. In addition, the sample processing evaluation apparatus 100 may be provided with a fluorescent X-ray signal detector that detects a fluorescent X-ray signal of a fluorescent X-ray generated from the sample and a backscattered electron signal detector that detects a backscattered electron signal of backscattered electrons. These detectors detect electrons generated from the processed surface of the sample 7 as will be described later.

The sample processing evaluation apparatus 100 further includes a sample holder 6 that holds and fixes the sample 7 and a sample stage 5 on which the sample holder 6 is placed. The sample stage 5 can move in directions of three axes X, Y, and Z that are not shown in the drawing. Furthermore, the sample stage 5 can be inclined and rotated as will be described later. The sample holder 6 can be attached to and detached from the sample stage. In a case of being detached from the sample stage, the sample holder 6 is an ordinary composite device of the FIB and the SEM.

The sample processing evaluation apparatus 100 further includes a sample stage control unit 15. The sample stage control unit 15 controls a drive mechanism, which is not shown in the drawing, to move the sample stage 5 in the directions of the three axes X, Y, and Z. Furthermore, the sample stage control unit 15 controls an inclination drive unit 8 to incline the sample stage 5 and controls a rotation drive unit 10 to rotate the sample stage 5.

The sample processing evaluation apparatus 100 further includes a sample holder control unit 60. The sample holder control unit 60 drives the sample holder 6, which is arranged on the sample stage 5, to set a direction of the sample 7 to a desired direction. A configuration and actions of the sample holder 6 will be described later in detail.

The sample processing evaluation apparatus 100 further includes an FIB control unit 11, an EB control unit 12, a GIB control unit 13, an image formation unit 14, and a display unit 18. The EB control unit 12 controls EB irradiation from the EB column 2. The FIB control unit 11 controls FIB irradiation from the FIB column 1. The GIB control unit 13 controls GIB irradiation from the GIB column 3. The image formation unit 14 forms an SEM image from image signals including a signal for scanning with the EB and the secondary electron signal of the secondary electrons detected by the secondary electron detector 4. The display unit 18 can display an observation image such as an SEM image, various control conditions of the apparatus, and the like. In addition, the image formation unit 14 forms an SIM image from a signal for scanning with the FIB and the signal of the secondary electrons detected by the secondary electron detector 4. The display unit 18 can also display the SIM image.

The sample processing evaluation apparatus 100 further includes an input unit 16 and a control unit 17. An operator inputs conditions related to control of the apparatus to the input unit 16. The input unit 16 transmits the input information to the control unit 17. The control unit 17 transmits control signals to the FIB control unit 11, the EB control unit 12, the GIB control unit 13, the image formation unit 14, the sample stage control unit 15, the display unit 18, and the sample holder control unit 60 and performs overall control of the apparatus.

In relation to the control of the apparatus, the operator sets an FIB irradiation region or a GIB irradiation region based on the observation image, such as the SEM image or the SIM image, displayed on the display unit 18, for example. The operator inputs, through the input unit 16, a processing frame for setting the irradiation region on the observation image displayed on the display unit 18. Furthermore, if the operator inputs an instruction for starting the processing to the input unit 16, signals for instructing the irradiation region and the start of the processing are then transmitted from the control unit 17 to the FIB control unit 11 or the GIB control unit 13, and the FIB control unit 11 or the GIB control unit 13 irradiates the designated irradiation region on the sample 7 with the FIB or the GIB. In doing so, the irradiation region input by the operator can be irradiated with the FIB or the GIB.

The sample processing evaluation apparatus 100 includes a gas gun 19 that supplies etching gas to the vicinity of the EB irradiation region, the FIB irradiation region, or the GIB irradiation region of the sample 7. As the etching gas, halogen gas such as chlorine gas, fluorine system gas (such as xenon fluoride or fluorine carbide), or iodine gas is used. It is possible to perform gas-assisted etching by the EB, the FIB, or the GIB by using the etching gas that reacts with a material of the sample 7. The gas-assisted etching by the EB, in particular, can realize etching processing without damaging the sample 7 due to ion sputtering. A gas gun control unit 20 controls the gas gun 19 for selection of gas and movement of the gas gun, for example.

The sample processing evaluation apparatus 100 further includes a calculation processing unit 21. The calculation processing unit 21 stores various data items such as image data including the SEM image that corresponds to the image signal generated by the image formation unit 14 and control data for the sample holder, and performs calculation based on the respective data items. For example, the calculation processing unit 21 can cause the display unit 18 to synthesize SEM images of four side surfaces of a sample with a quadrangular prism shape and display the synthesized image as a stereoscopic image, and can cause the display unit 18 to display the image in a rotated manner in an arbitrary direction as necessary.

Figure 2:
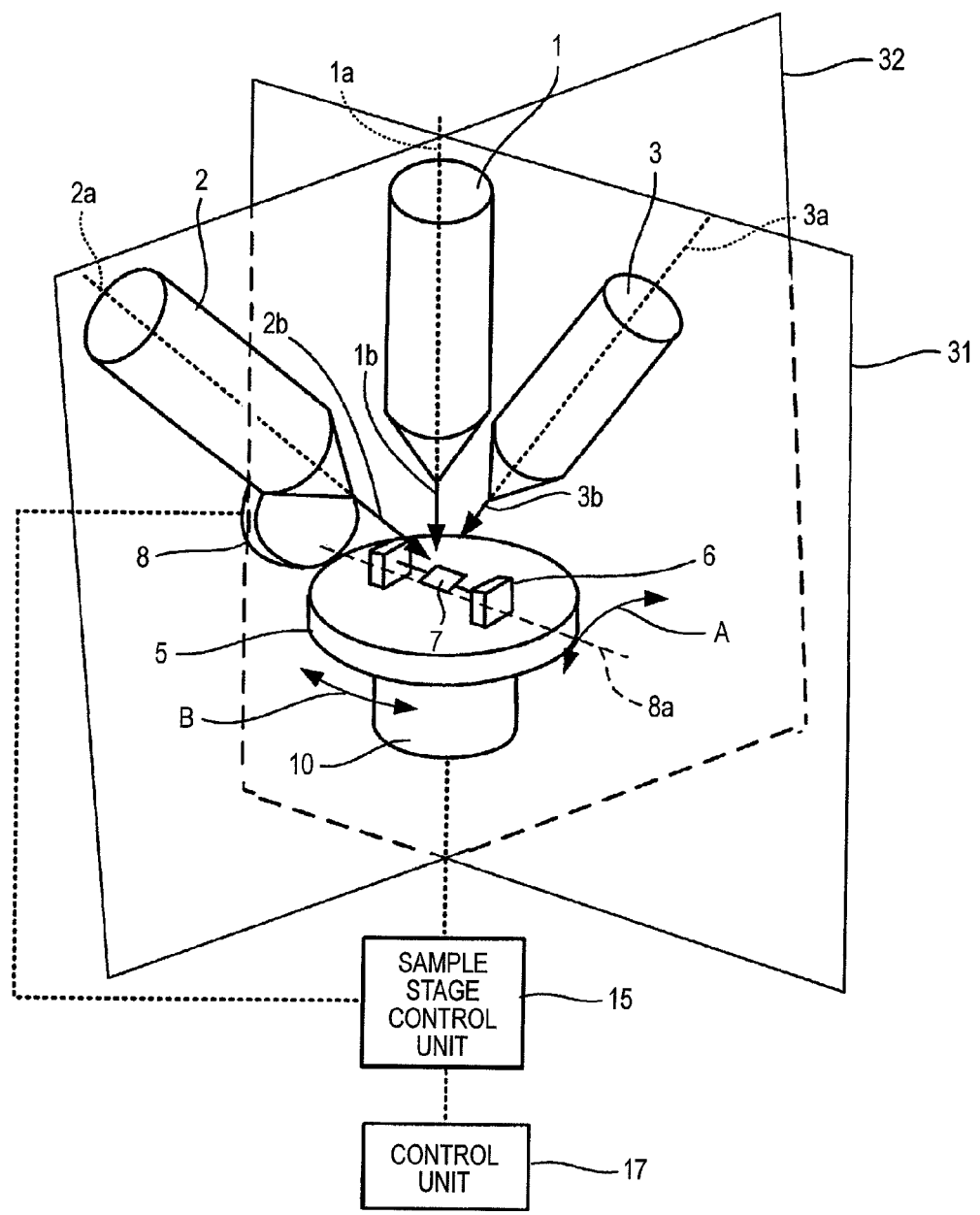
FIG. 2 is a configuration diagram of main parts of the sample processing evaluation apparatus according to the embodiment and illustrates operations of a sample stage and an arrangement relationship between the sample stage and the respective columns.

FIG. 2 illustrates main parts of the sample processing evaluation apparatus 100, operations of the sample stage 5 and an arrangement relationship between the sample stage 5, and the respective columns. In order to perform SEM observation on the sample 7, which is being processed, with an FIB 1*b* or a GIB 3*b*, a focused ion beam irradiation axis (FIB irradiation axis) 1*a* of the FIB column 1 and an electron beam irradiation axis (EB irradiation axis) 2*a* of the EB column 2 are arranged so as to intersect on the sample 7, the position of which has been adjusted by moving the sample stage 5, and the EB irradiation axis 2*a* of the EB column 2 and a gas ion beam irradiation axis (GIB irradiation axis) 3*a* of the GIB column 3 are also arranged in the same manner. That is, the irradiation position of the FIB 1*b* from the FIB column 1, the irradiation position of the EB 2*b* from the EB column 2, and the irradiation position of the GIB 3*b* from the GIB column 3 coincide on the sample 7.

In a case in which the sample stage 5 is located at a reference position, an upper surface of the sample stage 5 is in a relationship in which the sample stage 5 perpendicularly intersects the FIB irradiation axis 1*a*, an inclination axis 8*a* of the sample stage 5 is positioned in a first plane 31 that is formed by the FIB irradiation axis 1*a* and the GIB irradiation axis 3*a*, and the sample stage 5 can be inclined about the inclination axis 8*a* by the inclination drive unit 8 as an inclination mechanism. That is, the inclination drive unit 8 as the inclination mechanism can drive and incline the sample stage 5 as illustrated by the arrow A under control by the control unit 17 and the sample stage control unit 15.

A second plane 32 that is formed by the FIB irradiation axis 1*a* and the EB irradiation axis 2*a* is in a perpendicularly intersecting relationship with the first plane 31.

The sample stage 5 can also perform a rotating operation of rotating the sample 7 in a plane about the FIB irradiation axis 1*a* by the rotation drive unit 10. That is, the rotation drive unit 10 as a rotation mechanism drives and rotates the sample stage 5 in the plane as illustrated by the arrow B under control by the control unit 17 and the sample stage control unit 15. Various components such as a servomotor can be used for the rotation drive unit 10 as the rotation mechanism, and the type is not particularly limited.

Figure 3:
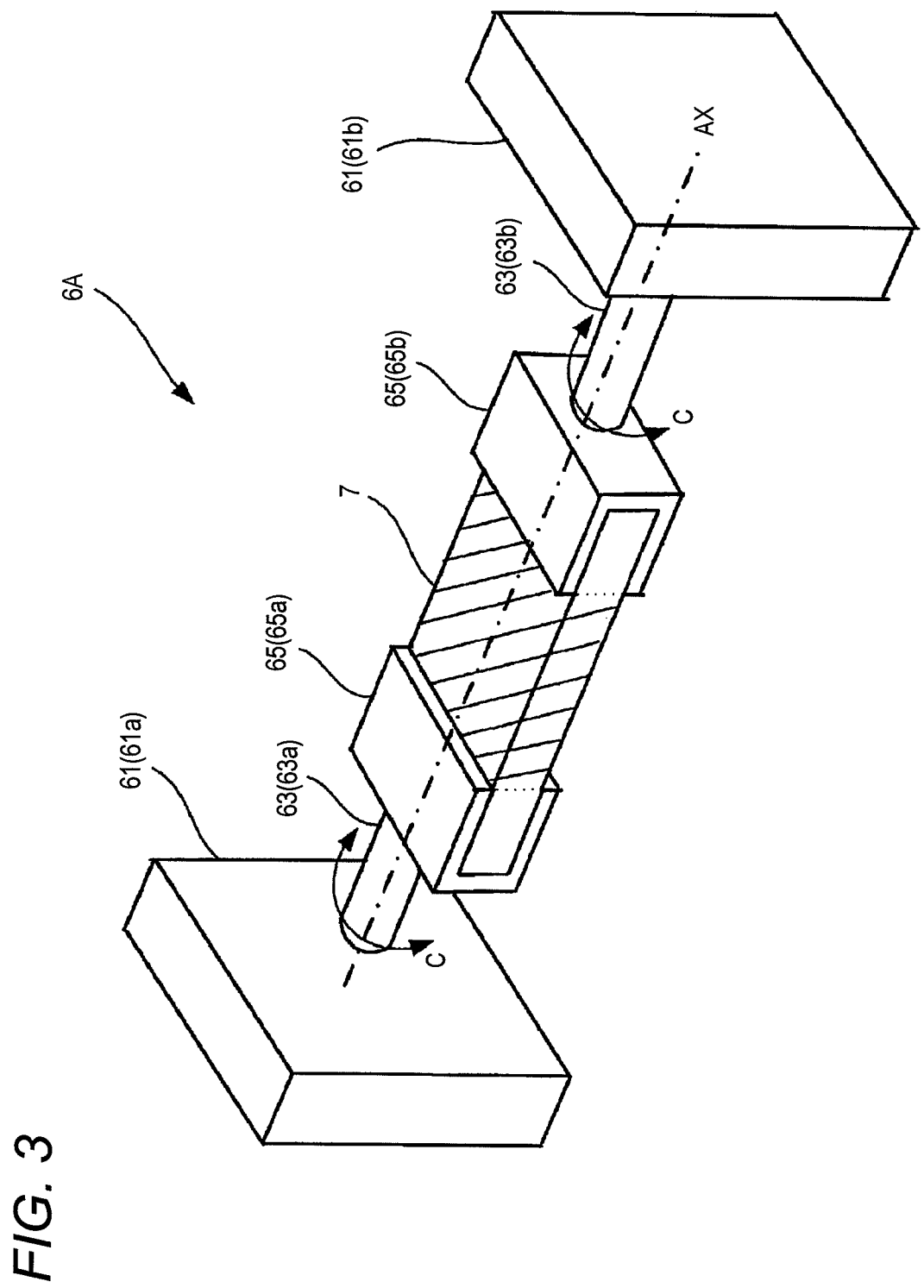
FIG. 3 is a perspective view illustrating a detailed configuration of a sample holder that is placed on the sample stage and holds a thin sample as an example of a target sample.

Next, a configuration, operations, and actions of the sample holder 6 that are arranged on the sample stage 5 will be described. As illustrated in FIG. 3, the sample holder 6 (a sample holder 6A in this case) includes a pair of support members 61 (61*a*, 61*b*) that are arranged directly on the sample stage 5, a pair of rotation shafts 63 (63*a*, 63*b*), and clamps 65 (65*a*, 65*b*) that are fixed to the pair of rotation shafts 63, respectively, and serve as a holding member that directly holds the sample 7.

The pair of support members 61 (61*a*, 61*b*) are fixed (may be detachable) to arbitrary positions on the sample stage 5, and the rotation shafts 63 (63*a*, 63*b*) are held by the pair of support members 61 (61*a*, 61*b*), respectively, in a rotatable manner. The rotation shafts 63a and 63b rotate in the same direction illustrated by the arrow C. The respective clamps 65a and 65b that are fixed to the rotation shafts 63a and 63b pinch and hold both ends of the sample 7 in a longitudinal direction.

The operator inputs, to the input unit 16, information related to the control of rotating the sample 7 by the rotation shafts 63a and 63b. The input unit 16 transmits the input information to the control unit 17. The control unit 17 transmits a control signal to the sample holder control unit 60, and the sample holder control unit 60 transmits drive signals to the rotation shafts 63a and 63b and rotates the rotation shafts 63a and 63b.

Since the rotation shafts 63 (63a, 63b) are rotated in the direction of the arrow C in a state in which the clamps 65 (65a, 65b) hold the sample 7 with rotation of the rotation shafts 63a and 63b, the sample 7 is also rotated in the direction of the arrow C. That is, the sample 7 can be rotated by 360° about a rotation axis AX that is parallel with the rotation shafts 63a and 63b. In this embodiment, the rotation shafts 63a and 63b are on the rotation axis AX, and the rotation axis AX is in a parallel relationship with the inclination axis 8a of the sample stage 5. Since the rotation axis AX of the sample holder 6A is located above the inclination axis 8a of the sample stage 5 by ΔZ (2 mm, for example), it is possible to observe with the EB 2b a portion, which has been processed with the FIB 1b, on the sample stage 5 by processing and observing the sample 7 while lowering the sample stage 5 by ΔZ in a Z-axis direction.

As a result of rotating the sample 7 on the sample stage 5, particularly between the sample stage 5 and the FIB column 1 and the EB column 2, about the rotation axis as described above, an outer periphery of the sample 7 can be directed to the upper side of the sample stage 5, that is, the side on which the FIB column 1, the EB column 2, and the GIB column 3 are arranged. Therefore, it is possible to observe and process the entire outer periphery (indicated by the hatched portion in FIG. 3 herein) including both surfaces (a front surface and a rear surface) of the sample 7 without removing the sample 7 from the sample processing evaluation apparatus 100.

Although it is also possible to rotate the sample 7 by causing the inclination drive unit 8 to drive and incline the sample stage 5 as illustrated by the arrow A (see FIG. 2), the sample 7 is rotated by only about ±60° from the reference position, and it is not possible to rotate the sample 7 by 360° as in the case of the rotation operation performed by the sample holder 6A. Since the sample holder 6A directly holds the sample 7, the sample holder 6A can more accurately control the position of the sample 7 than in the case of the inclination of the sample stage 5.

Figure 4A:
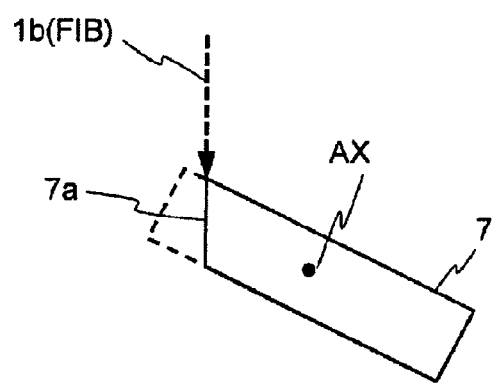
FIGS. 4A and 4B are diagrams schematically illustrating actions of the sample holder that rotates the thin sample, where
Figure 4B:
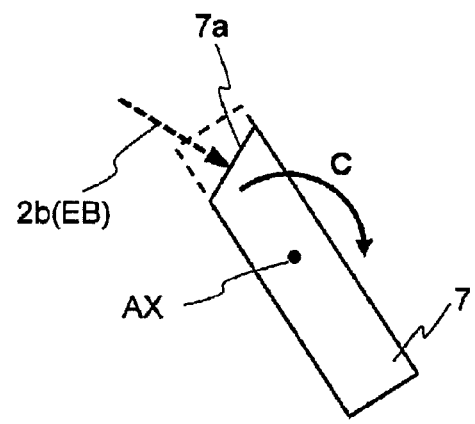

FIG. 4 is diagram schematically illustrating actions of the sample holder 6A that rotates the aforementioned sample 7. FIG. 4A illustrates that a processed surface (cut surface) 7a is formed by irradiating a part of the sample 7 with the FIB 1b. FIG. 4B illustrates a state in which the sample 7 is rotated in the direction of the arrow C about the rotation axis AX by using the sample holder 6A and the processed surface thereof is irradiated with the EB 2b for observation. That is, it is possible to finely adjust an irradiation angle, an irradiation position, and the like of the EB 2b with respect to the processed surface (cut surface) 7a and to thereby more precisely process and observe the sample 7. Although FIG. 4B illustrates a case in which the EB 2b and the processed surface 7a are in the vertical relationship, in particular, the angle of the incident EB 2b with respect to the processed surface 7a is not limited thereto. According to this embodiment, it is possible to enable not only observation and processing of the entire outer periphery of the sample 7 but also fine adjustment of the processing and the observation of the processed surface, for example, of the sample 7.

Although the sample processing evaluation apparatus 100 was exemplified as the sample processing evaluation apparatus in the aforementioned embodiment, the invention is not limited to the sample processing evaluation apparatus 100 and is applied to a sample processing evaluation apparatus that emits a single charged particle beam.

Although the FIB column 1 is arranged in a vertical direction in the above description, the FIB column 1 and the EB column 2 may be arranged in reversed positions.

Second Embodiment

Next, a description will be given of another embodiment of the sample processing evaluation apparatus according to the invention.

A TEM sample is produced by using a sample processing evaluation apparatus illustrated in FIG. 2. The TEM sample is a thin piece, and the thickness of a portion as a target of TEM observation ranges from about 10 nm to about 100 nm. Therefore, the sample should be carefully handled in order to prevent the sample from being damaged. In addition, a processing damaged layer (amorphous layer) is generated on the FIB irradiation surface at a location of about 10 nm to about 20 nm from the surface due to the FIB irradiation. The processing damaged layer makes a TEM observation image unclear. Since adhesion of foreign matter to the front and rear surfaces of the thin piece and the processing damage generated by the thin piece being irradiated with the FIB greatly affect the TEM observation, it is necessary to remove the adhering foreign matter and the processing damage from both surfaces of the thin piece. The foreign matter adhering to the thin piece and the FIB processing damage are removed (cleaned) by irradiation with a GIB with low acceleration energy.

The TEM sample is produced by a composite apparatus provided with an FIB column, an EB column, and a GIB column. First, a description will be given of a procedure in the related art with reference to FIGS. 5 to 7.

Figure 5A:
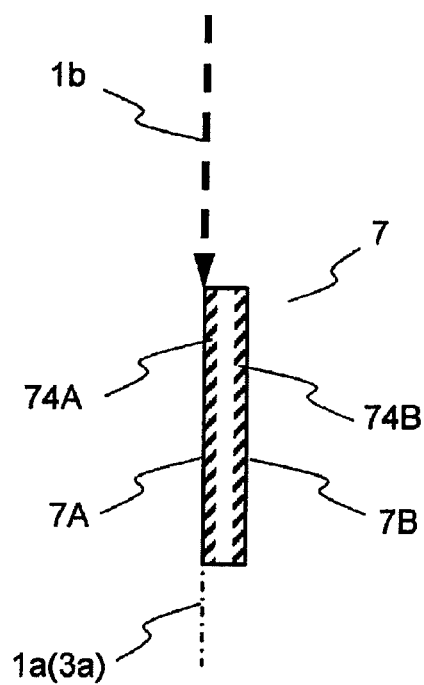
FIGS. 5A and 5B are explanatory diagrams of a production procedure of a thin sample for TEM observation by a sample processing evaluation apparatus in the related art.

FIG. 5 is diagram illustrating a procedure using an apparatus in the related art and is explanatory diagram schematically illustrating positional relationships between a section of the thin sample and the respective beams. FIG. 5A illustrates a situation in which the sample 7 is processed with the FIB 1b to have a thickness of about 100 nm. Processing damaged layers 74A and 74B are formed on the surfaces (side surfaces) 7A and 7B processed with the FIB 1b, respectively. Here, the processed surfaces 7A and 7B of the sample 7 are parallel with the FIB irradiation axis 1a.

Figure 5B:
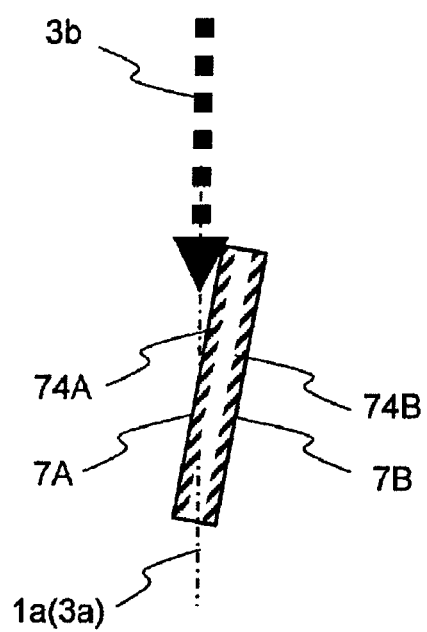

FIG. 5B illustrates a situation in which the sample is inclined by 10° in the clockwise direction with respect to the FIB irradiation axis 1a (that is, the sample stage is inclined with respect to a horizontal plane as a reference) and the processed surface is then irradiated with the GIB 3b in order to remove the processing damaged layer 74A on the processed surface 7A. The GIB 3b is a lower energy beam with an acceleration voltage of about 1 kV or less, a beam diameter thereof is several μm, which is thicker than that of the FIB, and the entire processed surface 7A can be easily flicked off by scanning with the GIB 3b. Thus, the foreign matter adhering to the processed surface 7A and the processing damaged layer can be removed (cleaned).

Figure 6A:
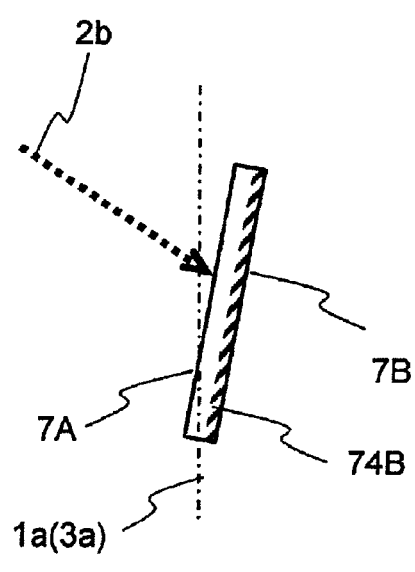
FIGS. 6A and 6B are explanatory diagrams of the production procedure of the thin sample for TEM observation by the sample processing evaluation apparatus in the related art.

FIG. 6A is a diagram illustrating a state in which the cleaned processed surface 7A is scanned with the EB 2b. It is possible to check a state that the processing damaged layer 74A has been removed based on definition of an SEM image obtained by the scanning with the EB 2b.

Figure 6B:
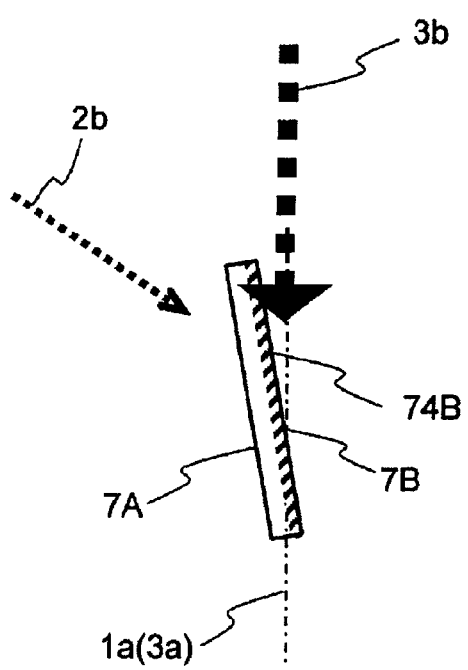

FIG. 6B illustrates a state in which the sample 7 on the sample stage is inclined by 20° in a counterclockwise direction from the state illustrated in FIG. 6A (inclined by 10° in the counterclockwise direction with respect to the FIB irradiation axis 1a) and the processed surface 7B is irradiated with the GIB 3b. The processed surface 7B can be cleaned with the GIB 3b by the inclination of the sample stage. However, the processed surface 7B after the irradiation with the GIB 3b cannot be observed with the EB 2b in this state. Thus, the sample 7 on the sample stage is rotated by 180° from the state illustrated in FIG. 6A. That is, the operation illustrated in FIG. 6B is not performed.

FIG. 7A illustrates a posture of the thin sample after rotating the sample stage by 180° from the state illustrated in FIG. 6A. Since the processed surface 7A is located at a position at which the processed surface 7A is irradiated with the GIB 3b, the sample stage is inclined by about 20° in the clockwise direction at this position.

FIG. 7B illustrates a state in which the processed surface 7B with the processing damaged layer 74B formed thereon is cleaned by irradiation with the EB 2b at a position at which the processed surface 7B can be irradiated with the GIB 3b, which is the lower energy beam, and the SEM observation is performed on the cleaned processed surface 7B by irradiating the cleaned processed surface 7B with the EB 2b at the cleaned posture.

As described above, it is possible to clean the processed surface 7B and to perform the SEM observation on the processed surface 7B. An ideal TEM sample with no processing damaged layers 74A and 74B formed on the both surfaces of the thin sample 7 can be obtained as described above. However, the inclination of the sample stage illustrated in FIGS. 5B and 7B and the rotation of the sample stage illustrated in FIG. 7A require time, and the sample is outside an observation sight in many cases. Therefore, there is a problem that it takes time to return the sample to the observation sight and to execute the following operation.

Thus, the aforementioned problem can be solved by producing a TEM sample by using the sample processing evaluation apparatus according to the invention. FIG. 8 is a diagram illustrating a procedure employed by the sample processing evaluation apparatus according to the embodiment.

FIG. 8A illustrates a state in which the both surfaces of the sample 7 are processed by the irradiation with the FIB 1b at an initial position and the processing damaged layers 74A and 74B are formed on the respective processed surfaces 7A and 7B in the same manner as in FIG. 5A. Although the FIB 1b (the FIB irradiation axis 1a) is illustrated above the processed surface 7A in this drawing, the processed surface 7B can also be processed by deflection of the FIB 1b since the thickness of the sample 7 (the traverse width on the paper) is as thin as about 100 nm.

In FIG. 8B, the sample holder 6A is rotated by 10° in the clockwise direction about the rotation axis AX in order to clean the processed surface 7A next. Here, the processed surface 7A can be cleaned by irradiating the processed surface 7A with the GIB 3b with low energy. Since the beam diameter of the GIB 3b is as thick as several μm, the entire processed surface 7A can be cleaned by slightly performing the beam scanning.

FIG. 9A illustrates a situation in which the cleaned processed surface 7A is scanned with the EB 2b and the SEM observation is performed on the cleaned processed surface 7A. According to another procedure, the SEM observation may be performed in a positional relationship in which the processed surface 7A can be vertically irradiated with the EB 2b by further rotating the sample holder by a predetermined angle in the clockwise direction about the rotation axis AX. The predetermined angle can be obtained from an angle that is formed by the EB irradiation axis and the FIB irradiation axis as configurations of the charged particle beam composite apparatus and an inclination angle of the sample during the cleaning. If the angle that is formed by the EB irradiation axis and the FIB irradiation angle are 50°, and the inclination angle of the sample during the cleaning is 10°, for example, the predetermined angle is 40°. The cleaned processed surface can be vertically viewed with the EB 2b as described above without inclining the sample stage.

FIG. 9B illustrates a situation in which the processed surface 7B is cleaned. The processed surface 7B is located at a position at which the processed surface 7B can be irradiated with the GIB 3b by rotating the sample holder by 180° about the rotation axis AX from the state illustrated in FIG. 9A. Here, the processing damaged layer 74B on the processed surface 7B can be removed and cleaned by irradiating the processed surface 7B with the GIB 3b with low energy.

In FIG. 9C, the SEM observation can be performed on the processed surface 7B by scanning the processed surface 7B with the EB 2b in a state in which the processed surface 7B has been cleaned. According to another procedure, the SEM observation may be performed in a positional relationship in which the processed surface 7B can be vertically irradiated with the EB 2b by further rotating the sample holder by a predetermined angle in the clockwise direction about the rotation axis AX. In addition, it is possible to obtain a scanning transmission electron microscope (STEM) image, which is an image obtained by electrons that penetrate through the sample 7, by arranging a transmission electron detector (not shown) behind the sample 7 (in an advancing direction of the EB 2b) and scanning the sample 7, the both processed surfaces of which have been cleaned, with the EB 2b, and it is possible to determine whether the sample is suitable for the TEM observation. If contamination or an unclear portion is found in the sample 7, the both surfaces of which have been cleaned, based on the STEM image, the cleaning may be further promoted by performing the irradiation with the GIB 3b again without moving the sample 7 or after rotating the sample holder to obtain the positional relationship in which the processed surface 7A can be irradiated with the GIB 3b.

According to the sample processing evaluation apparatus of the invention, it is possible to clean the both surfaces of the thin sample processed with the FIB by irradiating both the surfaces with the GIB 3b and to perform the SEM observation or the STEM observation with the EB 2b without inclining or rotating the sample stage, and to thereby save the time required for the inclination and the rotation of the sample stage. In addition, it is possible to vertically view the sample surface after the cleaning with the SEM, which cannot be performed by the procedure in the related art (FIGS. 5 to 7), and to thereby realize more detailed observation.

Figure 10:
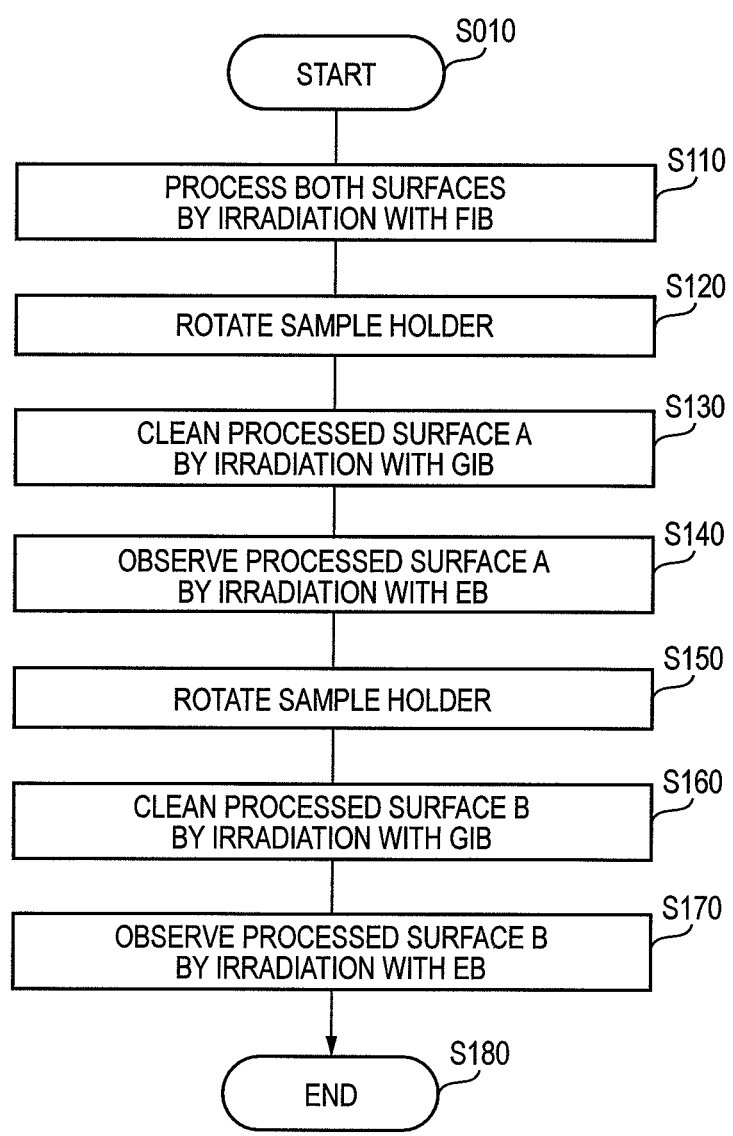
FIG. 10 is a flowchart illustrating the production procedure of the thin sample for TEM observation by the sample processing evaluation apparatus according to the embodiment of the invention.

Next, a description will be given of an operation procedure of the sample processing evaluation apparatus according to the embodiment. FIG. 10 is a flowchart illustrating an operation procedure in a case of producing a thin sample like a TEM sample. First, the flow starts when the control unit 17 moves the sample stage and the sample reaches a position for processing with the FIB (Step S010). The control unit 17 irradiates the both surfaces of the sample with the FIB and processes the sample to a thin sample with a thickness of about 100 nm (Step S110).

Next, the control unit 17 rotates the sample holder 6 by 10° in the clockwise direction (Step S120). Then, the control unit 17 irradiates the thin sample with the GIB with low energy and cleans the side surface (processed surface) of the thin sample (Step S130).

The processed surface is observed by irradiating the cleaned processed surface with the EB (Step S140). At this time, the image formation unit 14 generates an image of the processed surface from image signals including a signal for the scanning with the EB and a signal of secondary electrons detected by the secondary electron detector 4, and the display unit 18 displays the image. The calculation processing unit 21 may store image data corresponding to the image signals and form the image based on the stored image data, and the display unit 18 may display the image.

Next, the control unit 17 rotates the sample holder by 180° in the clockwise direction (Step S150). In this step, the sample is installed at such a position that an uncleaned surface of the sample is irradiated with the GIB. The sample holder 6 may be rotated and adjusted such that the processed surface is vertical to the EB axis between Step S130 and Step S140. Then, the control unit 17 irradiates the sample with the GIB with low energy and cleans the other surface of the sample (Step S160).

Furthermore, the processed surface is observed by irradiating the cleaned processed surface with the EB in the same manner as in Step S140 (Step S170). The sample holder may be rotated and adjusted such that the processed surface is vertical to the EB axis between Step S160 and Step S170. The processing for obtaining the thin sample (processing for producing the TEM sample) is completed by performing the aforementioned series of flow without inclining, rotating, or moving the sample stage 5 (Step S180).

It is possible to automatically process and clean the two surfaces of the sample by the control unit 17 sequentially causing the EB control unit 12, the FIB control unit 11, the GIB control unit 13, and the sample holder control unit 60 to operate in conjunction with one another to perform Steps S100 to S180 as described above.

Although only the two surfaces A and B as in FIGS. 8 and 9 are processed in the flowchart illustrated in FIG. 10, the invention is not limited thereto, and the flow may be repeated to process three surfaces for a sample with a triangular prism shape or to process four surfaces for a sample with a quadrangular prism shape.

Although Step S110 may be performed for the respective surfaces immediately before the cleaning, such a configuration is unfavorable for a sample for which the TEM observation is performed after the processing since there is a risk that sputtered particles generated during the later processing and cleaning adhere to and contaminate the previously cleaned processed surface. On the other hand, the processing by the irradiation with the FIB, the cleaning with the GIB, and the observation with the EB may be repeated for the respective processed surfaces for the purpose of simply obtaining the SEM images of the processed surfaces.

Figure 11:
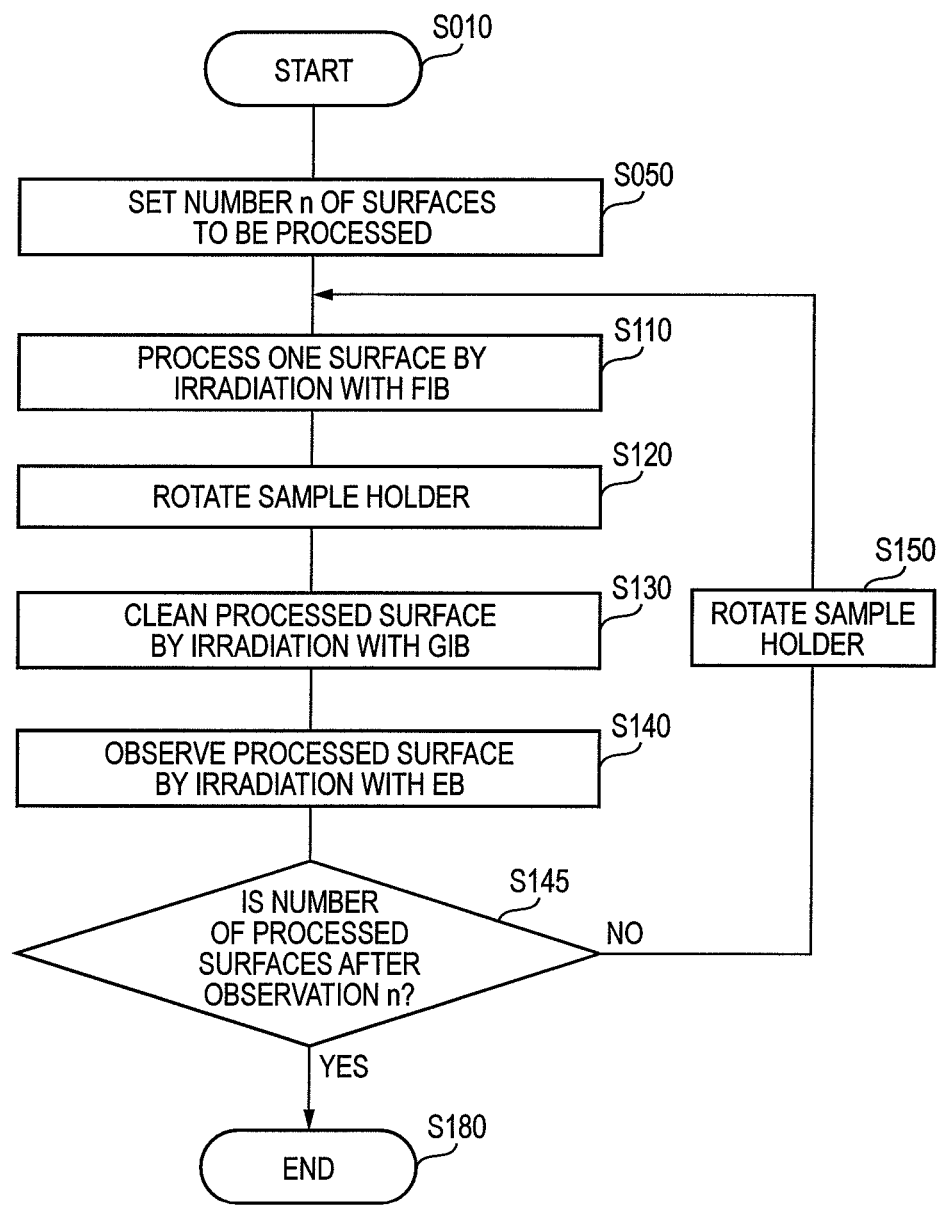
FIG. 11 is another flowchart illustrating the production procedure of the sample by the sample processing evaluation apparatus according to the embodiment of the invention.

FIG. 11 is a flowchart illustrating a case in which the processing by the irradiation with the FIB, the cleaning with the GIB, and the observation with the EB are repeated for the respective processed surfaces. In FIG. 11, the same operations are performed in the respective steps with the same step numbers as those in FIG. 10.

After the start of the operation flow (Step S010), the number of surfaces of the sample to be processed is set (Step S050). Three is set for a sample with a triangular prism shape, four is set for a sample with a quadrangular prism shape, and n is set for a sample with a polygonal prism shape with n side surfaces. In a case of processing surfaces, which have already been processed, again and repeating processing, cleaning, and image acquisition for all the side surfaces of the sample with quadrangular prism shape, for example, it is only necessary to set an integral multiple of four.

Next, a surface of the sample is processed with the FIB (Step S111). The following Steps S120 to S140 are performed in the same manner as described above. After the completion of Step S140, it is determined whether or not the accumulated number of surfaces observed in previous Step S140 is the same as the number of surfaces set in Step S050 (Step S145). If so, the processing proceeds in the direction of Y in the flowchart. If not, the processing proceeds in the direction of N.

If the processing proceeds in the direction of N, then the sample holder 6 is rotated by a predetermined angle in the following step (Step S150). The predetermined angle is an angle that can be obtained from the number of surfaces of the sample, is 90° for a quadrangular prism shape, is 120° for a regular triangular prism shape, and is 60° for a regular hexagonal prism, for example.

After the completion of Step S150, the processing returns to Step S111, then proceeds to the following steps up to Step S145, and is repeated until the accumulated number of the observed surfaces becomes the same as the number of the surfaces set in Step S050. When the accumulated number of the observed surface becomes the same as the number of the surfaces set in Step S050, the processing proceeds in the direction of Y in the flowchart, and the series of flow is completed (Step S180).

Third Embodiment

Hereinafter, a description will be given of another embodiment of the sample holder 6 in the sample processing evaluation apparatus according to the invention.

Figure 12:
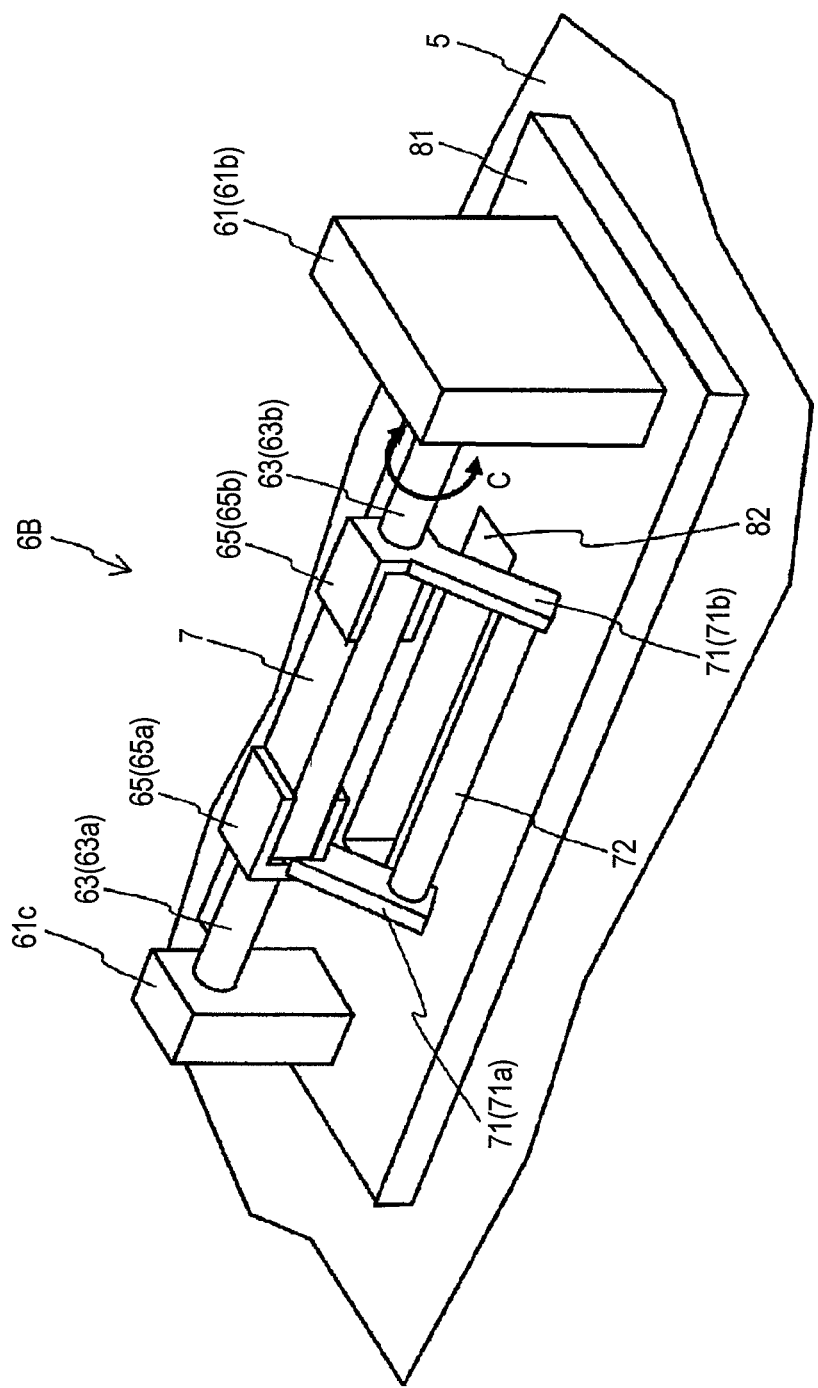
FIG. 12 is a perspective view illustrating a detailed configuration of a sample holder that is placed on a sample stage and holds a thin sample according to another embodiment.

FIG. 12 is an explanatory perspective view of another sample holder 6B for rotating a sample. What is also different from the embodiment (sample holder 6A) illustrated in FIG. 3 is that the rotation shaft 63b that spontaneously rotates as illustrated by the arrow C is present only on one side of the sample 7 and the rotation shaft 63a at the other end of the sample 7 has a structure of being simply supported in a rotatable manner by a support member 61c for smooth rotation. In a case in which both end supports for preventing rotation of the sample 7 from deviating are present on both sides of the sample, there is a risk that torsion force is generated in the sample 7 due to a slight difference in rotation timing or rotation speeds of the rotation shafts 63 on both sides and the minute sample 7 immediately breaks. Therefore, the rotation shaft 63b that spontaneously rotates is arranged only on one side of the sample 7, and the rotation shaft 63a at the other end does not spontaneously rotate and simply follows the rotation of the rotation shaft 63b.

In FIG. 12, the sample holder 6B includes a pair of support members 61 (61c, 61b) that are arranged directly on the sample stage 5, a pair of rotation shafts 63 (63a, 63b), clamps 65 (65a, 65b) as holding units that are fixed to the pair of rotation shafts 63, respectively, and directly hold the sample 7, arms 71 (71a, 71b) that extend from the clamps 65 in a direction vertical to the rotation axis, and a coupling unit 72 that couples the arms 71a and 71b. Since the rotation shaft 63a continues to the rotation shaft 63b via rigid bodies such as the clamp 65a, the arm 71a, the coupling unit 72, and the arm 71b, rotation force is not delivered to the sample 7, and a rotation angle of the rotation shaft 63b with respect to the support member 61b is delivered to the rotation shaft 63a without any difference. Therefore, no twisting occurs at both ends of the sample 7, and 360° rotation about the axis can be realized.

These components of the sample holder 6B are fixedly installed on the base 81, and the base 81 can be attached to and detached from the sample stage 5. As for installation of the sample 7 on the sample holder 6B, the sample holder 6B integrated with the base 81 that has been extracted from the sample processing evaluation apparatus is fixed below a microscope such as an optical microscope (not shown).

A recessed portion 82 is provided in the base 81 and the sample stage 5 immediately below the sample 7. The recessed portion 82 is provided for the purpose of preventing deterioration in cleanliness, which is obtained with an effort, of the processed surface due to adhesion of sputtered particles, which are generated from a portion in the base 81 or the sample stage 5 irradiated with the FIB 1b that has passed through the vicinity of the sample 7 or has passed through the sample after processing the sample 7, to the processed surface of the sample 7.

Figure 13:
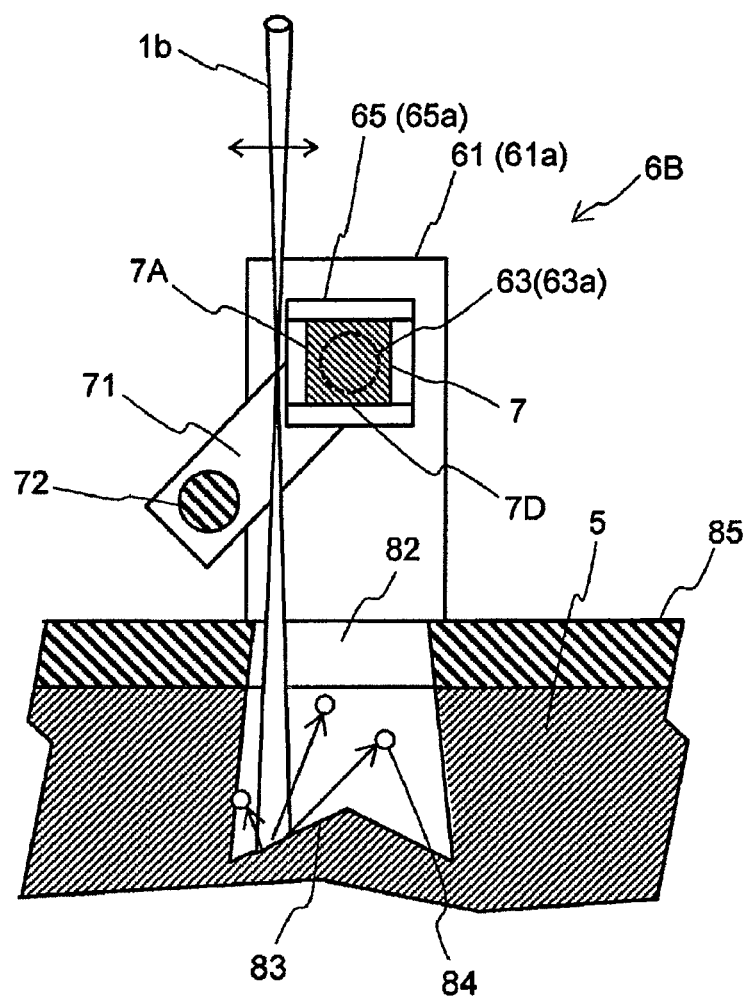
FIG. 13 is a sectional view of the sample holder and the sample stage (a part thereof)

FIG. 13 is a sectional view of the sample holder 6B taken along a line that is vertical to the rotation axis AX and passes through the substantially center portion of the sample 7, and illustrates positional relationships of the sample 7, the clamp 65b, the arm 71b, the coupling unit 72, the sample stage 5, and the recessed portion 82. A deep bottom surface 83 of the recessed portion 82 is irradiated with the FIB 1b that has passed through the sample 7. The recessed portion 82 has a wider bottom than an opening in a surface 85 of the sample stage 5 such that sputtered particles 84 generated from the bottom surface 83 that has been irradiated with the FIB 1b cannot easily exit the recessed portion 82 and do not adhere to the sample 7, in particular. In addition, the bottom surface 83 of the recessed portion 82 is inclined with respect to the surface 85 of the sample stage 5 so as to minimize the amount of the sputtered particles 84 adhering to the sample. The amount of the sputtered particles that reach the sample 7 is significantly reduced by the deep bottom surface 83 and the shape of the recessed portion 82 as described above. Preferably, the recessed portion 82 is a hole that penetrates through the sample stage 5 in the best mode.

In a case in which the sample 7 is at the reference position, the coupling unit 72 is not present immediately below the sample 7 and is located at a position at which the coupling unit 72 does not block the recessed portion 82 immediately below the sample 7 and the coupling unit 72 cannot be directly irradiated with the FIB 1b. In addition, the coupling unit 72 has such a dimension that the coupling unit 72 is not brought into contact with the sample stage, the FIB column, the EB column, and the GIB column even if the sample 7 is rotated by 360°. Therefore, the coupling unit 72 does not prevent secondary electrons generated from the surface of the sample from reaching the secondary electron detector even in a case of observing the processed surface of the sample 7 with the EB.

Next, a description will be given of a method of processing a sample with a quadrangular prism shape by using the sample processing evaluation apparatus on which the sample holder 6B illustrated in FIGS. 12 and 13 is mounted.

According to the sample processing evaluation apparatus of the invention, four side surfaces of a sample (mineral or whisker, for example) with a quadrangular prism shape that is shaped in advance to have a square section with a side of 100 μm and is processed to have a length of 4 mm are cut by the FIB, SEM images of the four processed surfaces are obtained, and image data is stored on the calculation processing unit 21. The calculation processing unit 21 can synthesize the stored SEM images of the four side surfaces, reconstruct a developed image, a stereoscopic image, or a three-dimensional image of the quadrangular prism based on the SEM images, and observe the image of the target sample in four directions.

The operations of cutting the four side surfaces and obtaining images are repeated while information relating to the cut surfaces and the cutting thickness obtained by the FIB 1b is stored on the calculation processing unit 21, and image data is stored on the calculation processing unit 21. It is possible to reconstruct, from the cut surfaces, the cutting thickness, and the SEM image data accumulated in the calculation processing unit 21, a three-dimensional image with which internal configurations of the quadrangular prism can also be recognized. For example, it is possible to reproduce, as a stereoscopic image, a hole or foreign matter with a unique configuration in the sample with the prism shape.

A description will be given of the method of repeating the operations of cutting the four side surfaces and obtaining images as described above, with reference to an embodiment in which the sample holder 6B is used. FIGS. 14A to 14C are diagrams illustrating only the sample holder 6B illustrated in FIGS. 12 and 13. FIGS. 14A to 14C illustrate rotation, processing, and observation in this order.

FIG. 14A illustrates a process of processing side surfaces (processed surfaces) 7A and 7C of the sample 7. The FIB 1b is made to approach the side surface 7A or 7C to be processed, and the side surfaces 7A and 7C are cut by a predetermined thickness (10 nm, 20 nm, 50 nm, or 100 nm, for example). At this time, the coupling unit 72 is located on the lower right side and does not prevent the processing of the sample 7 with the FIB 1b, and the coupling unit 72 is not directly irradiated with the FIB 1b. In addition, the surface of the sample stage 5 is not irradiated with the FIB 1b that has passed through the sample 7, and sputtered particles from the surface of the sample stage 5 do not adhere to a side surface 7D that faces the surface of the sample stage 5. After the cutting of the side surfaces 7A and 7C is completed, an SEM image of the side surface 7A is obtained with the EB 2b, and image data is saved in the calculation processing unit 21. Here, the cut surface may be cleaned by irradiating the side surface 7 with the GIB 3b immediately before the SEM image of the side surface 7A is obtained with the EB 2b. The cleaning of the cut surface brings about an advantage that definition of the SEM image is enhanced. Thereafter, the rotation axis of the sample holder is rotated by 90° in the counterclockwise direction.

FIG. 14B is a sectional view of the sample holder after the rotation. Here, the side surface 7C processed in the previous process is located at an upper surface. Therefore, an SEM image of the side surface 7C is obtained first. Here, the cut surface may be cleaned by irradiating the processed surface with the GIB 3b immediately before the SEM image is obtained with the EB 2b.

Then, side surfaces (processed surfaces) 7B and 7D of the sample are processed with the FIB 1b. After the processing, an SEM image of the side surface 7B is obtained with the EB 2b, and image data is saved in the calculation processing unit 21. Here, the cut surface may be cleaned by irradiating the processed surface with the GIB 3b immediately before the SEM image is obtained with the EB 2b. Thereafter, the rotation axis of the sample holder is rotated by 90° in the counterclockwise direction.

FIG. 14C is a sectional view of the sample holder after the rotation. Since the side surface 7D processed in the previous process is located at the upper surface, an SEM image of the side surface 7D is obtained. Here, the cut surface may be cleaned by irradiating the processed surface with the GIB 3b immediately before the SEM image is obtained with the EB 2b.

The SEM images of the four side surfaces 7A, 7B, 7C, and 7D can be obtained by the series of operations. In addition, it is possible to obtain a large amount of data without any manpower by controlling the respective control devices to work in conjunction with each other so as to sequentially and automatically perform the aforementioned cutting of the side surfaces with the FIB, the cleaning with the GIB, the image acquisition with the EB, the saving of the image data, and the rotation of the sample holder.

A developed SEM image of the four side surfaces can be synthesized by using the aforementioned SEM image data of the side surfaces. In addition, it is also possible to synthesize the SEM image data in a quadrangular prism shape and to view a stereoscopic SEM image while rotating the image about the axis of the sample.

Since the acquisition of the image of the processed surface with the EB 2b is performed immediately after the processing with the FIB 1b in the aforementioned embodiment, the EB 2b is obliquely incident on the processed surface. The invention is not limited to this method, and the SEM image may be obtained after obtaining a vertical relationship between the processed surface and the EB 2b by performing rotation and adjustment immediately after the processing with the FIB 1b. It is possible to vertically view the processed surface without the coupling unit 72 interrupting the irradiation with the EB 2b even in this case. The series of operations including the cutting with the FIB, the cleaning with the GIB, the rotation and the adjustment of the sample holder, the image acquisition with the EB, the saving of the image data, and the rotation of the sample holder may be automated by also automating the rotation and the adjustment of the sample holder to obtain the vertical relationship between the processed surface and the EB 2b.

The operations for the four side surfaces (one cycle) of the quadrangular prism were described in the aforementioned embodiment, the invention is not limited thereto, and a plurality of cycles for processing the four side surfaces may be performed. The cycles may be continued until the sample disappear due to the processing. It is possible to calculate the approximate number of cycles based on the cutting amount per cycle and the thickness of the sample. An internal structure of the sample (in a depth direction from the surface of the sample) can be recognized by a series of operations for the plurality of cycles.

FIG. 15 is diagram schematically illustrating images obtained by three-dimensionally reconstructing all image data items that are obtained by repeating the cutting of the four side surfaces with the FIB 1b and the image acquisition with the EB 2b until the sample disappears, by using the sample processing evaluation apparatus according to the invention. FIG. 15A is a stereoscopic SEM image of a quadrangular prism shape that is obtained by synthesizing SEM image data of the four side surfaces, and it is possible to recognize that there are three layers 93A, 93B, and 93C with brightness contrast in the sample.

FIG. 15B is a stereoscopic SEM image that is reconstructed such that an oblique section of the original sample with the quadrangular prism shape is exposed, based on all the data items obtained by repeating the cutting and the image acquisition. In this image, it is possible to recognize that there is foreign matter 95, which cannot be recognized only in the observation image of the four side surfaces (FIG. 15A), in the layer 93B. As described above, a section in an arbitrary direction can be exposed since all the data items of the sample 7 are used.

FIG. 16A is a three-dimensional reproduced image 96 of the sample with the quadrangular prism shape based on all the data items obtained by repeating the cutting and the image acquisition. From layers 97A, 97B and 97C that are inclined with respect to the axis of the sample with the quadrangular prism shape, it is possible to recognize that foreign matter 98 with an oval sphere shape spreads in the layer 97B. Forming an image by extracting image data with specific brightness from all the data makes it possible to display a three-dimensional image focused on a specific layer or a specific structure.

FIG. 16B is a developed diagram 99 (a synthesized diagram of the SEM images) of the sample with the quadrangular prism shape. The outer periphery of the sample can be grasped at a glance.

Fourth Embodiment

Next, a description will be given of another embodiment of the sample processing evaluation apparatus according to the invention.

In this embodiment, the ability of the sample holder 6 in the sample processing evaluation apparatus capable of rotating by 360° about the axis in a state in which the sample 7 is mounted thereon is used. It is possible to perform measurement of crystal orientation and the like, namely so-called electron backscatter diffraction (EBSD) image analysis from a backscattered electron (reflected electron) signal obtained by irradiating a crystal sample with the EB at a small angle with respect to the surface of the sample by using the apparatus and to thereby repeat cutting and EBSD evaluation of the sample 7. Furthermore, three-dimensional EBSD evaluation can be realized by performing the EBSD evaluation every time the sample 7 is cut.

Figure 17A:
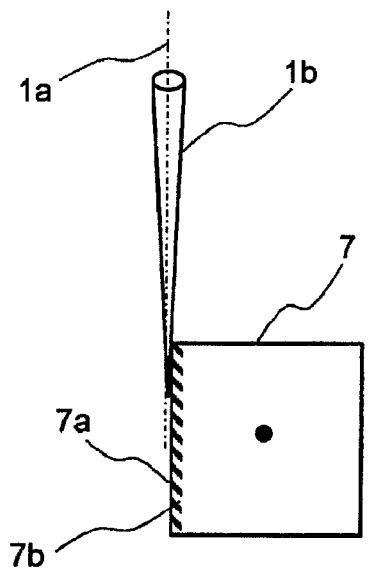
FIGS. 17A to 17D are explanatory diagrams of a sample evaluation procedure by a sample processing evaluation apparatus according to an embodiment.

FIGS. 17A to 17D are diagrams illustrating a procedure for obtaining an EBSD image of a polycrystalline sample with a quadrangular prism shape that is mounted on the sample holder 6, and are sectional views taken along the second plane 32 (see FIG. 2) including the FIB axis and the EB axis. The rotation axis of the sample holder 6 is vertical to the paper surface. First, FIG. 17A is a diagram illustrating FIB processing of a specific surface of the sample 7 with the quadrangular prism shape. The sample 7 is installed such that the specific surface becomes parallel with the FIB irradiation axis 1a and is cut by a predetermined thickness (100 nm, for example) by irradiation with the FIB 1b.

Figure 17B:
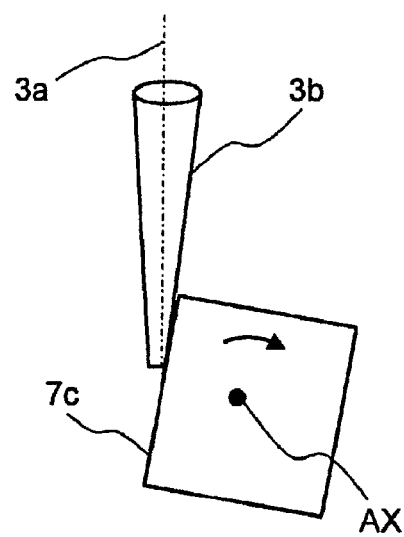

An FIB irradiation damaged layer 7b is formed on the processed surface 7a in some cases. FIG. 17B illustrates a state in which the FIB irradiation damaged layer 7b is removed by irradiation with the GIB 3b immediately after the processing by the irradiation with the FIB 1b. The rotation axis AX is rotated such that the processed surface 7a is at an angle of about 10° in the clockwise direction with respect to a surface that is formed by the FIB irradiation axis 1a and the GIB irradiation axis 3a. The FIB irradiation damaged layer 7b is removed (cleaned) by the irradiation with the GIB 3b, the layer with a thickness of about 10 nm is removed from the FIB processed surface 7a, a cleaned surface 7c is exposed, and crystal particles prominently appear.

Figure 17C:
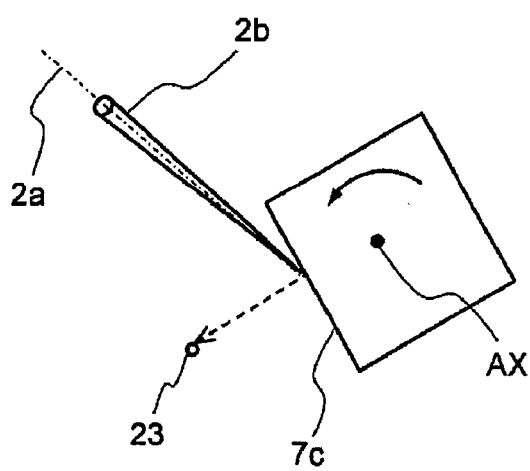

FIG. 17C illustrates a state in which the cleaned surface 7c is irradiated with the EB. The sample holder 6 is rotated by a predetermined angle such that the cleaned surface 7c and the EB irradiation axis 2a are located at a predetermined angle. If an angle that is formed by the FIB irradiation axis 1a and the EB irradiation axis 2a in the sample processing evaluation apparatus is in a positional relationship of −50° in the counterclockwise direction, for example, the predetermined angle of the rotation axis AX of the sample holder 6 is set to −30°, for example. Therefore, the sample holder 6 is rotated by −40° in the counterclockwise direction from the position illustrated, in FIG. 17B. The angle that is formed by the cleaned surface 7c and the EB irradiation axis 2a is an angle that is as relatively low as 20° by such setting. It is important to perform the irradiation with the EB at a low angle with respect to the cleaned observation surface as described above. An image indicating crystal orientation of the cleaned surface 7c to be observed can be obtained by irradiating the cleaned surface 7c with the EB 2b, detecting, by a dedicated detector (not shown), reflected electrons (backscattered electrons) 23 generated by the irradiation with the EB 2b, and saving signal data in the calculation processing unit 21 and analyzing the signal data after the sample holder 6 is rotated by the predetermined angle. The image may be displayed on the display unit 18 as necessary.

Figure 17D:
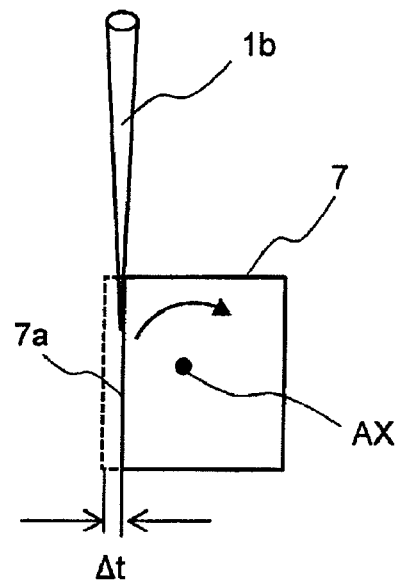

FIG. 17D illustrates a state in which the sample holder 6 is then returned to the original angle (the same position as that in FIG. 17A). At this time, the sample 7 is moved by a predetermined thickness (Δt; 100 nm, for example) in a thickness direction and is cut by Δt. Alternatively, the sample 7 may be cut by polarizing the FIB by Δt determined in advance without moving the sample 7 by the predetermined thickness. Thereafter, the aforementioned procedure including the predetermined rotation of the sample holder 6, the cleaning of the processed surface (FIG. 17B), the predetermined rotation of the sample holder 6, the acquisition of the backscattered electrons 23 (FIG. 17C), and the moving of the processed surface (FIG. 17D) is repeated, and the FIB processing is completed if the total cutting amount or the number of times of cutting reaches a predetermined value. The value Δt is not limited to the aforementioned value, and it is possible to construct a three-dimensional image with high resolution by setting the value Δt to a small value such as 10 nm. The calculation processing unit 21 can construct an image indicating three-dimensional arrangement of the crystal particles based on the image data accumulated until then and the data of the respective cutting amounts (Δt). Once the image indicating the three-dimensional crystal particle arrangement can be constructed, an image indicating crystal orientation in an arbitrary section in the image can be reconstructed.

The rotation angle of the sample holder when the backscattered electrons 23 are detected is not limited to the aforementioned rotation angle. The rotation angle of the rotation axis AX of the sample holder 6 may be determined in advance based on the angle that is formed by the FIB irradiation axis 1a and the EB irradiation axis 2a, the incident angle of the EB 2b with respect to the cleaned surface 7c, and the positional relationship of the reflected electron (backscattered electron) detector or the secondary electron detector.

Figure 18:
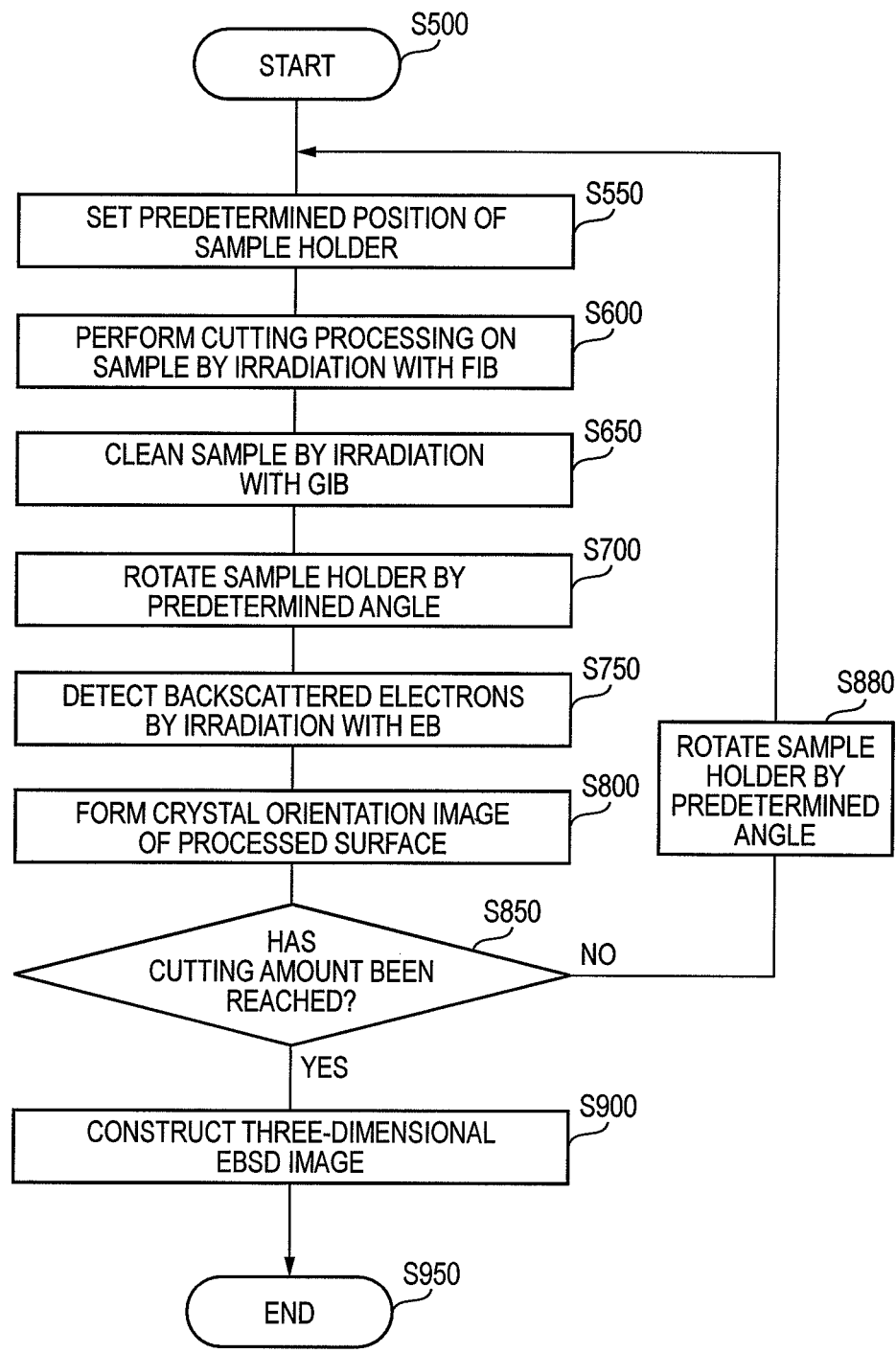
FIG. 18 is an explanatory flowchart of the sample evaluation procedure by the sample processing evaluation apparatus according to the embodiment.

FIG. 18 is a flowchart illustrating the series of procedure described with reference to FIG. 17. The series of flow for three-dimensional EBSD measurement is started (Step S500).

First, the sample stage 5 and the sample holder 6 are set such that a predetermined surface of the sample 7 is located at a position at which the predetermined surface is irradiated with the FIB (Step S550). Then, the surface of the sample 7 is cut by a predetermined thickness by irradiation with the FIB (Step S600). In a case in which a damaged region (amorphous layer) is formed on the surface processed by the irradiation with the FIB and affects observation with the EB, the damaged region is removed (cleaned) by irradiation with the GIB (Step S650). At this time, the sample holder 6 is rotated in advance about the axis to a predetermined position such that the surface processed with the FIB is located at an appropriate position for the irradiation with the GIB. Then, the sample holder 6 is rotated by a predetermined angle so as to be located at an optimal position for irradiation with the EB (Step S700). The processed surface that has been cleaned in Step S650 is irradiated with the EB, and backscattered electrons generated from an irradiated portion of the cleaned surface 7c are detected (Step S750). The detected signal is saved in the calculation processing unit 21, the image formation unit 14 forms an images therefrom, and a crystal orientation image of the processed surface is formed on the display unit 18 (Step S800). Although it is possible to form an EBSD image, the EBSD image is only an image of one surface. Therefore, it is possible to form a stereoscopic (three-dimensional) EBSD image with a thickness by determining the total cutting amount in advance.

In Step S850, it is determined whether a cutting amount by the irradiation with the FIB, which is determined in advance, (the cutting thickness or the number of times of cutting) has been achieved after Step S800. If the cutting amount has not reached a predetermined amount (N in Step S850), the sample holder 6 is rotated by a predetermined angle such that the sample is oriented in the same direction as that in Step S550 (S880). Then, the position of the processed surface is set to a predetermined position by moving the sample stage, for example (S550). Thereafter, the aforementioned flow is repeated up to Step S850.

If it is determined in Step S850 that the predetermined cutting by the irradiation with the FIB (the cutting thickness or the number of times of cutting) has been completed (Y in Step S850), a three-dimensional EBSD image is reconstructed from EBSD image information accumulated in the calculation processing unit until then and cutting thickness information and is displayed on the display unit (Step S900). The series of flow is completed by the aforementioned procedure, and the flow for the three-dimensional EBSD measurement ends (Step S950).

The aforementioned series of flow from Step S500 to Step S950 can be performed by automatically and sequentially operating the calculation processing unit 21 and the control unit 17, which manages the FIB control unit 11, the EB control unit 12, the GIB control unit 13, the image formation unit 14, the sample stage control unit 15, and the sample holder control unit 60 in FIG. 1 in accordance with a program determined in advance. The image may be automatically displayed on the display unit 18.

Although the sample 7 is typically finished with the GIB 3b, gas-assisted etching with the EB 2b or the FIB 1b may be used instead of the GIB 3b. In a case of using the FIB 1b, it is preferable that beam energy of the FIB 1b is changed for processing for forming a section of the sample 7 and for finishing the sample 7. That is, a steep section is formed at a high speed by using the accelerated FIB 1*b* at an acceleration voltage from 30 kV to 40 kV, which is a beam with a small beam diameter, in the processing for forming the processed surface 7*a* of the sample 7, and the sample is processed with less damage by using the less accelerated FIB 1*b* at an acceleration voltage from about 1 kV to about 10 kV, which is a beam that enters the sample 7 by a short length, in the processing for finishing the sample 7. In doing so, it is possible to perform the finishing with less damage.

Although the stereoscopic image or the three-dimensional image is reconstructed based on the SEM image (secondary electron image) data in the embodiment, the invention is not limited thereto, and it is possible to display three-dimensional distribution of elements that form the target sample or three-dimensional distribution of crystal orientation based on a fluorescent X-ray or a backscattered electron signal that is obtained by irradiating the processed surface of the sample with the EB 2*b*. In such a case, it is a matter of course that installation of an appropriate detector is necessary. However, the detector is not illustrated in FIG. 1. In addition, a three-dimensional image can be reconstructed for a short period of time.

Although the description was given of the sample with the prism shape in the embodiment, the shape of the sample is not limited thereto, and a thin plate-shaped sample for a transmission electron microscope (hereinafter, referred to as a TEM) may be employed. The shape of the sample can be confirmed in advance with the SEM from both the front and rear surfaces of the processed TEM sample. Since the TEM sample is significantly thin and fine, in particular, a sample holder which does not apply torsion force to both ends of the sample is preferably used.

Although the sample 7 is typically finished with the GIB 3*b*, gas-assisted etching with the EB 2*b* or the FIB 1*b* may be used instead of the GIB 3*b*. In a case of using the FIB 1*b*, it is preferable that beam energy of the FIB 1*b* is changed for processing for forming the processed surface 7*a* of the sample 7 and for finishing the sample 7. That is, a steep section is formed at a high speed by using the accelerated FIB 1*b* at an acceleration voltage from 30 kV to 40 kV, which is a beam with a small beam diameter, in the processing for forming the processed surface 7*a* of the sample 7, and the sample is processed with less damage by using the less accelerated FIB 1*b* at an acceleration voltage from about 1 kV to about 10 kV, which is a beam that enters the sample 7 by a short length, in the processing for finishing the sample 7. In doing so, it is possible to perform the finishing with less damage.

Fifth Embodiment

Next, a description will be given of another embodiment of the sample processing evaluation apparatus according to the invention. In this embodiment, an example in which a sample is produced and torsion from among mechanical properties is evaluated in the same place will be described.

Figure 19:
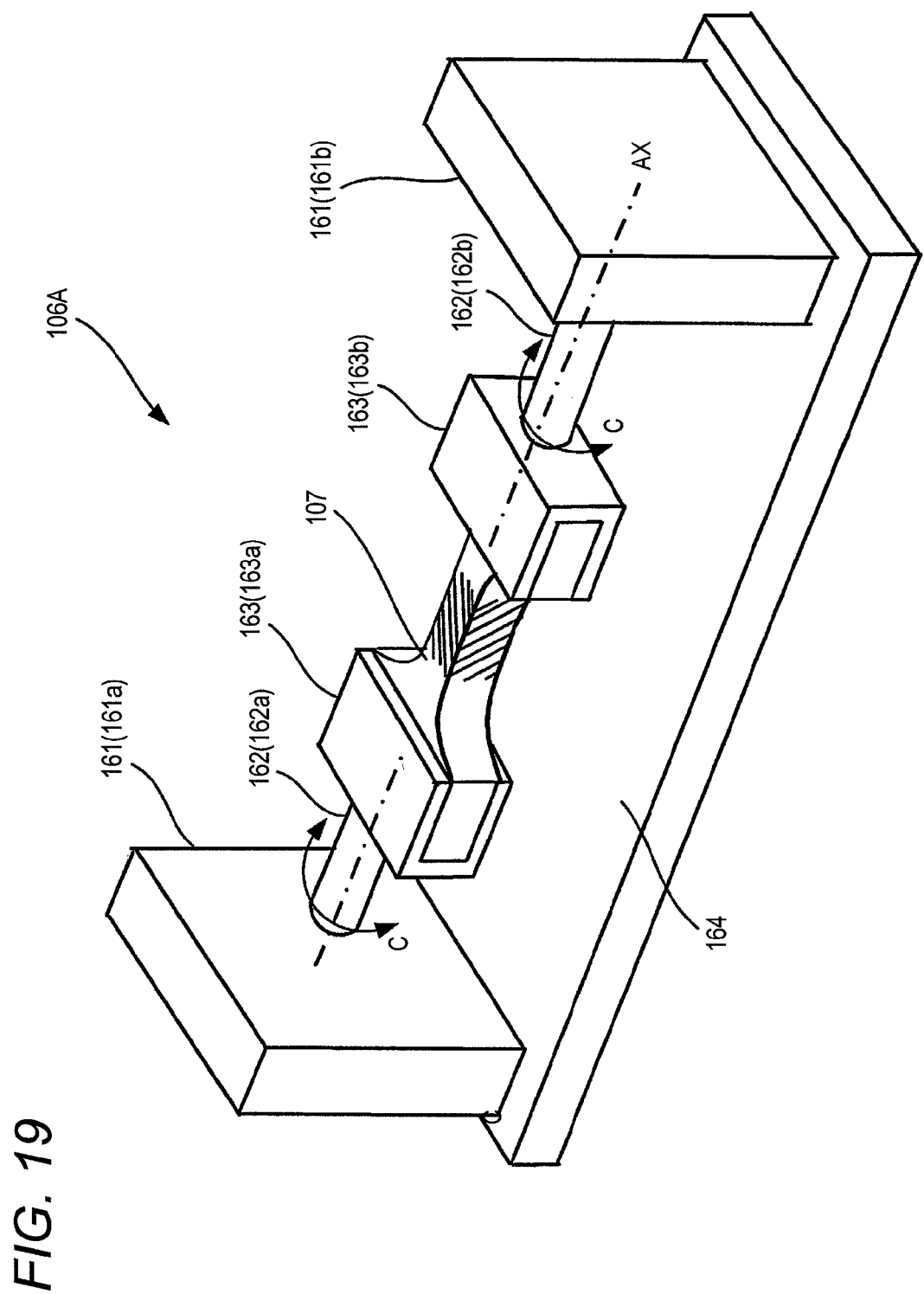
FIG. 19 is a perspective view illustrating a detailed configuration of a sample holder that is placed on a sample stage and holds a sample.

First, a configuration, operations, and actions of the sample holder 106 that is installed so as to be attachable to and detachable from the sample stage 5 and is used in the fifth embodiment will be described. FIG. 19 illustrates an embodiment of a sample holder 106 (a sample holder 106A herein), and the sample holder 106A includes a pair of rotation control units 161 (161*a*, 161*b*) that are arranged on a base 164, a pair of rotation shafts 162 (162*a*, 162*b*), and clamps 163 (163*a*, 163*b*) as holding units for holding a sample (sample piece) 107. The sample holder 106A is fixed so as to be attachable to and detachable from an upper surface of the sample stage 5 via the base 164.

The rotation control unit 161 according to the embodiment includes a rotatable piezoelectric element and the like, and the piezoelectric element with a diameter of 3 mm and a length of 30 mm exhibits a performance of 0.1° angle resolution. The rotation control unit 161 can control rotation of the rotation shaft 62 and thus control rotation of the sample 107 based on a control signal corresponding to a signal that is supplied from the sample holder control unit 60.

The rotation shafts 162 (162*a*, 162*b*) that couples the rotation control units 161 (161*a*, 161*b*) and the clamps 163 (163*a*, 163*b*) are rotatably held by the pair of respective rotation control units 161 (161*a*, 161*b*). Rotation axes of the rotation shafts 162*a* and 162*b* are on the same rotation axis (torsion axis) AX, and the rotation control units 161*a* and 161*b* rotate the rotation shafts 162*a* and 162*b*, respectively, in the same direction at the same speed as illustrated by the arrow C. The rotation control units 161*a* and 161*b* can perform operations of starting and stopping the rotation of the rotation shafts 162*a* and 162*b* at the same timing. In addition, the rotation control units 161*a* and 161*b* can also bring one of the rotation shafts 162*a* and 162*b* into a rotatable state while fixing the other in an unrotatable state. In doing so, it is possible to apply torsion force to the sample 107. It is possible to burden the torsion force onto the sample 107 while bringing one of the rotation shafts 162*a* and 162*b* into a fixed state and bringing the other into a rotatable state after operating the rotation shafts 162*a* and 162*b* at the same time by the rotation control units 161*a* and 161*b* and stopping a focused surface of the sample 107 at an angle at which the focused surface can be easily observed with the SEM. At this time, the torsion axis of the sample 107 is the same as the aforementioned rotation axis AX. The respective clamps 163*a* and 163*b* pinch and hold both ends of the sample 107. Both ends of the sample 107 may be fixed to the clamps 163 (163*a*, 163*b*) with an adhesive.

The operator can input conditions for the application of the torsion force (a minimum torsion angle, a final torsion angle, and a torsion speed, for example) to the sample 107 through the input unit 16. The input unit 16 transmits the input information to the control unit 17. The control unit 17 transmits a control signal to the sample holder control unit 60, and the sample holder control unit 160 can transmit drive signals to the rotation control units 161*a* and 161*b* and rotate or stop the rotation shafts 162*a* and 162*b*.

The rotation axis AX of the rotation control unit 161 is in a parallel relationship with the inclination axis 8*a* of the sample stage 5. In addition, since the rotation axis AX of the sample holder 106 is located above the inclination axis 8*a* of the sample stage 5 by AZ (5 mm, for example), substantially the same portion of the sample 107 can be irradiated with the FIB 1*b* and the EB 2*b* only by lowering the sample stage 5 by AZ in the Z-axis direction when the sample 107 is processed or observed, and the portion processed with the FIB 1*b* can be observed with the EB 2*b* while being held by the sample holder 106 even if the sample 107 is rotated.

Since the sample 107 that is handled by the sample processing evaluation apparatus 100 is small and a region as a target of the torsion evaluation is as minute as less than 1 mm, the sample 107 is easily deformed if the sample 107 is handled with human hands, and it is difficult to install the sample 107 on the sample holder 106 in a no-load state. Thus, the sample as the target of the torsion evaluation is formed into such a shape that the sample itself is not easily deformed even if the sample is handled with human hands for installation on the sample holder according to the sample processing evaluation apparatus 100, and the sample is processed to have a desired dimension with one of or both the FIB 1b and the GIB 3b installed on the sample processing evaluation apparatus 100 after fixation to the clamps.

An exemplary dimension of the sample 107 will be described. The sample 107 before the installation on the sample holder 106 has an entire length of 30 mm, an entire width of 10 mm, and a thickness of 100 µm (FIG. 19 schematically illustrates the dimension) and is shaped by mechanical processing from both sides such that a narrow portion with a width of 1 mm and a length of 5 mm remains at the center of the entire width at the center in the longitudinal direction. The sample 107 has the both ends that serve as fixed portions fixed with the clamps 163 and the center narrow portion (hatched portion in FIG. 19) for measuring mechanical properties (SEM evaluation). The sample 107 is a so-called dumbbell-shaped test piece. Projections and processing marks are removed from the sample 107 in order to prevent stress from being focused on portions other than the narrow portion. After fixing the sample 107 to the clamps 163, processing is performed by irradiating the sample 107 with one of or both the FIB 1b or the GIB 3b such that the narrow portion has a width of 100 µm, a length of 200 µm, and a thickness of 100 µm, for example, and has a shape that is not discontinuous from the shape obtained by the previously performed mechanical processing. In addition, the shape of the sample is not limited to the aforementioned shape, and a plate shape, a prism shape, or a cylindrical shape is also applicable instead of the dumbbell shape.

Since no stress is applied to the sample 107 during the processing in the case of processing with the ion beams such as the FIB 1b and the GIB 3b, deformation and internal stress accumulation do not occur due to the processing. However, an FIB irradiation damaged layer with a thickness of about 10 nm is formed on the surface processed with the FIB. Although the FIB irradiation damaged layer does not greatly change the mechanical properties of the sample, it is preferable to remove the FIB irradiation damaged layer in a case in which the sample 107 is as significantly small as 1 µm or less or in consideration of observation and analysis of the surface of the sample. The FIB irradiation damaged layer can be removed (cleaned) by irradiation with the GIB with low energy. Since the sample holder 106 can be rotated by 360° about the rotation axis AX without applying any load to the sample 107, all the side surfaces of the sample 107 are cleaned by rotating the sample 107 by 90° for each side surface in a case of an observation target with a quadrangular prism shape, and a final sample is then obtained.

At the timing when the cleaning of the four surfaces of the sample 107 is completed, the focused surface is set at a vertical angle with respect to the EB irradiation axis 2a, the rotation control unit 161a at one end fixes the rotation shaft 162a so as not to rotate the rotation shaft 162a, the rotation control unit 161b at the other end gradually rotates the rotation shaft 162b in accordance with conditions determined in advance, and torsion force is applied to the sample 107. First, an SEM image is obtained in a no-load state, and thereafter, a load is gradually applied. The SEM image of the same region is obtained every time a specific load is added, and is stored on the calculation processing unit 21 along with a torsion load value.

The loading and the image acquisition are repeated until the sample 107 breaks. In doing so, it is possible to grasp tendency of occurrence of minute cracking and how the cracking propagates in a level of crystal particles. In addition, it is possible to observe and record changes in shapes of the crystal particles due to the torsion and how the minute cracking occurs and propagates in real time.

Although the surface of the sample is observed based on the SEM image in the aforementioned embodiment, the invention is not limited thereto, and an image may be formed by reflected electrons or an X-ray generated from the sample by irradiation with the EB. The surface state can be observed by the reflected electrons in a more sensitive manner as compared with the secondary electrons, and it is possible to clarify elements that form the sample 107 by an X-ray signal.

In addition, a transmission image may be formed by processing the focused portion of the sample 107 to be ultrafine or thin to a level of several tens of nm and detecting electrons, which are transmitted during the EB irradiation, by a transmission electron detector (omitted in the drawing). In doing so, the inside of the sample can be observed in an atomic level.

Sixth Embodiment

Next, a description will be given of another embodiment of the sample processing evaluation apparatus according to the invention.

Figure 20:
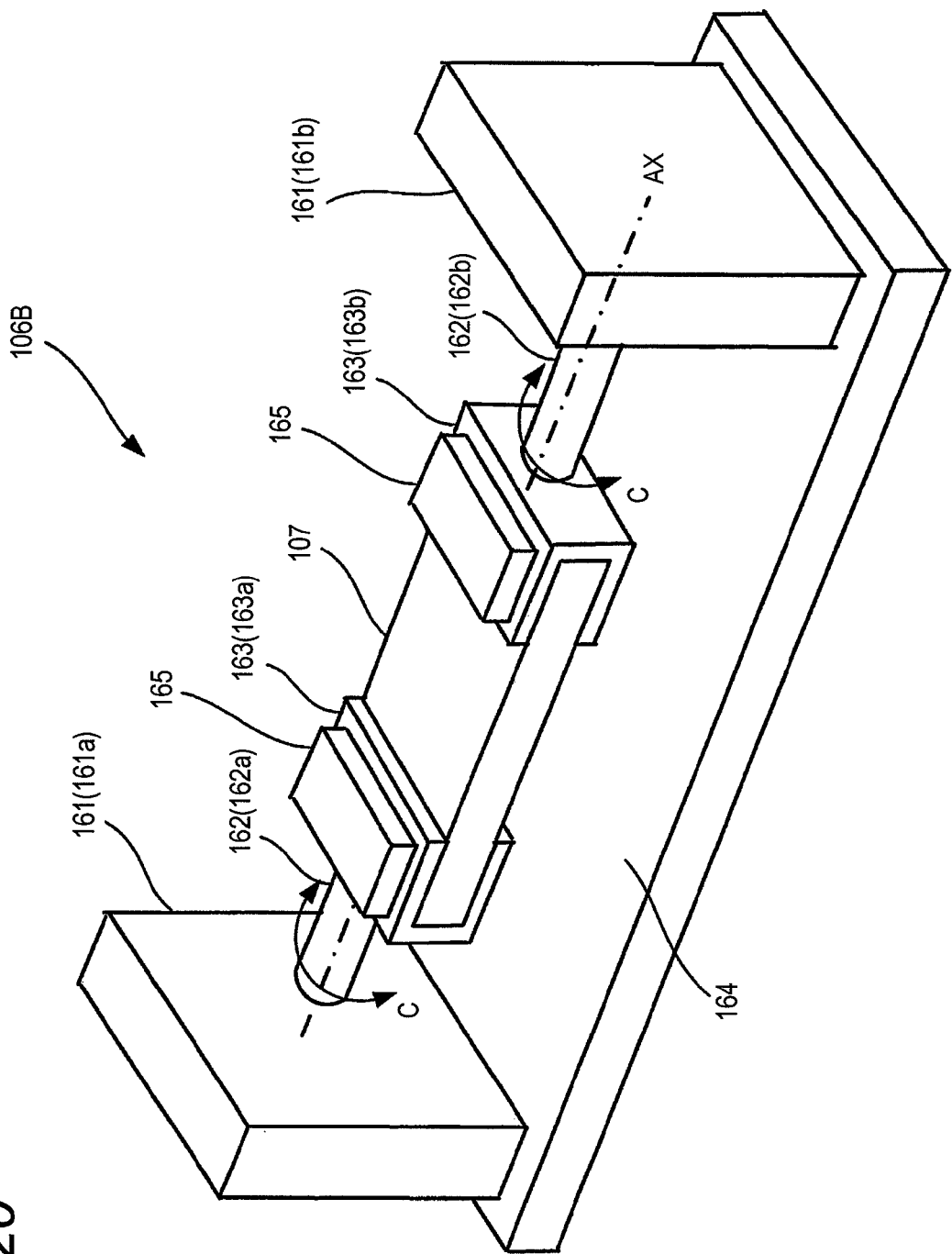
FIG. 20 is a diagram illustrating a sample holder according to another embodiment.

FIG. 20 illustrates a sample holder 106B that is used when a torsion property of the sample 107 during heating is evaluated. According to this embodiment, heaters (ceramic heaters, for example) 165 are provided at the clamps 163a and 163b, and the sample 107 can be heated via the clamps 163a and 163b. The temperature of the sample 107 can be measured by an infrared radiation thermometer (omitted in the drawing) in a non-contact manner from the outside of the sample processing evaluation apparatus. With such a configuration, it is possible to set temperature conditions of the sample 107 in addition to the torsion force and to observe behaviors of the crystal particles on the surface of the torsion sample at various temperatures. In a case in which the sample 107 is made of polycrystalline alloy AB that consists of metal A and metal B, for example, in particular, behaviors of the crystal particles of the metal A and of the crystal particles of the metal B at various temperatures can be grasped from element distribution in an EB irradiation range (SEM observation region) by detecting a property X-ray generated by the irradiation with the EB.

According to the sample processing evaluation apparatus of the invention, it is possible to know phenomena such as movement of crystal particles, slipping, and occurrence of cracking in the sample 107 in a heated state and under a torsion force loaded condition as described above. The installation positions of the heaters 165 are not necessarily limited to the clams 163, and the heaters 165 may be installed at the rotation shafts 162 or the rotation control units 161, for example. It is preferable that the heaters are located at both ends of the sample 107, have the same temperature properties (a temperature rising speed, the highest temperature, a temperature dropping speed, and the like), and operate at the same time. A heater may be installed only on one side of the sample 107.

Although the heaters are installed and the torsion evaluation is performed during heating in the aforementioned description, it is also possible to evaluate a torsion property during cooling by installing a cooler such as a Peltier element instead of the heaters.

Although the sample processing evaluation apparatus 100 provided with the FIB column, the EB column, and the GIB column was exemplified as the sample processing evaluation apparatus in the aforementioned embodiment, the invention is not limited thereto and is also applied to a sample processing evaluation apparatus provided with a single beam column or a combination of two columns from among the aforementioned three columns. Although the FIB column 1 is arranged in the vertical direction in the aforementioned description, the FIB column 1 and the EB column 2 may be arranged in the reversed positions.

Figure 21:
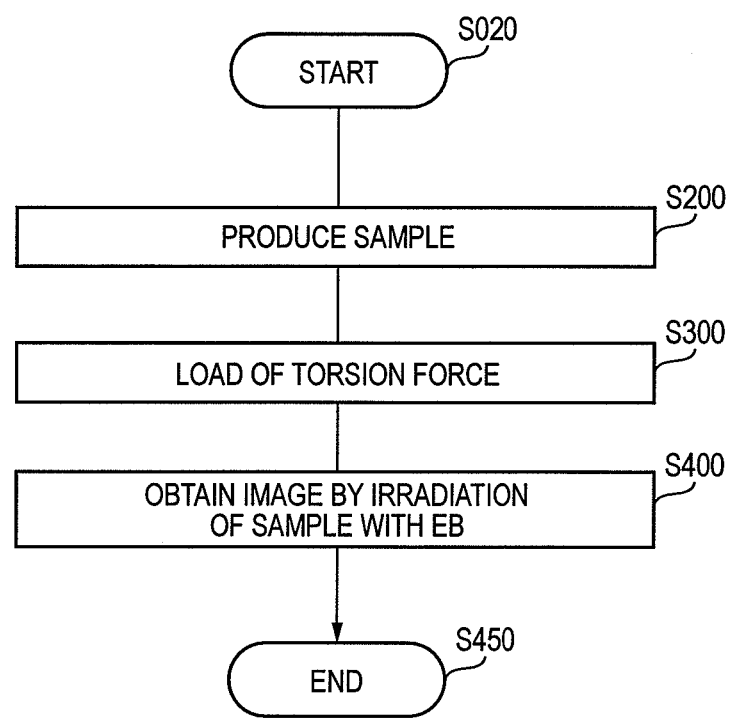
FIG. 21 is an explanatory flowchart of a procedure for evaluating torsion of a sample by the sample processing evaluation apparatus according to the embodiment.

FIG. 21 is a flowchart illustrating an exemplary procedure for evaluating torsion of a sample by the sample processing evaluation apparatus.

First, the torsion evaluation flow is started at the timing when the sample holder 106 to which the sample 107 is fixed is attached to the sample processing evaluation apparatus and it is confirmed that the mounted charged particle beams (the FIB, the EB, and the GIB, for example) are in a state in which the charged particle beams can exhibit predetermined performance (Step S020). The sample is produced by processing the sample 107 that is fixed to the sample holder 106 into a predetermined shape and a dimension by using a function of rotating the sample stage and a function of cutting the side surfaces of the sample with the FIB and cleaning the surfaces (Step S200). The rotation axis of the sample holder 106 is adjusted such that a focused surface of the sample is located at such a position that the surface can be observed with the EB, the rotating function of the rotation shaft 162 (the rotation shaft 162a, for example) is fixed by one rotation control unit 161 (the rotation control unit 161a, for example) determined in advance, the rotation shaft 162 (the rotation shaft 162b, for example) is rotated at a speed and a rotation angle under a load determined in advance by the other rotation control unit (the rotation control unit 161b, for example), and a load of torsion force is applied to the sample 107 (Step S300). An image signal is obtained by irradiating the sample 107 with the EB at the timing corresponding to the load and the angle determined in advance (Step S400). The image signal is at least one kind of secondary electrons, reflected electrons (backscattered electrons), transmission electrons, and an X-ray generated during the irradiation with the EB, and an image is formed based on the signal. The load may be increased in Step S300 as necessary, and acquisition of the image in Step S400 may be repeated. The series of torsion evaluation flow is completed when the sample 107 breaks or a maximum load or a maximum angle determined in advance is reached (Step S450). This is a basic flow of the torsion evaluation using the sample processing evaluation apparatus.

Figure 22:
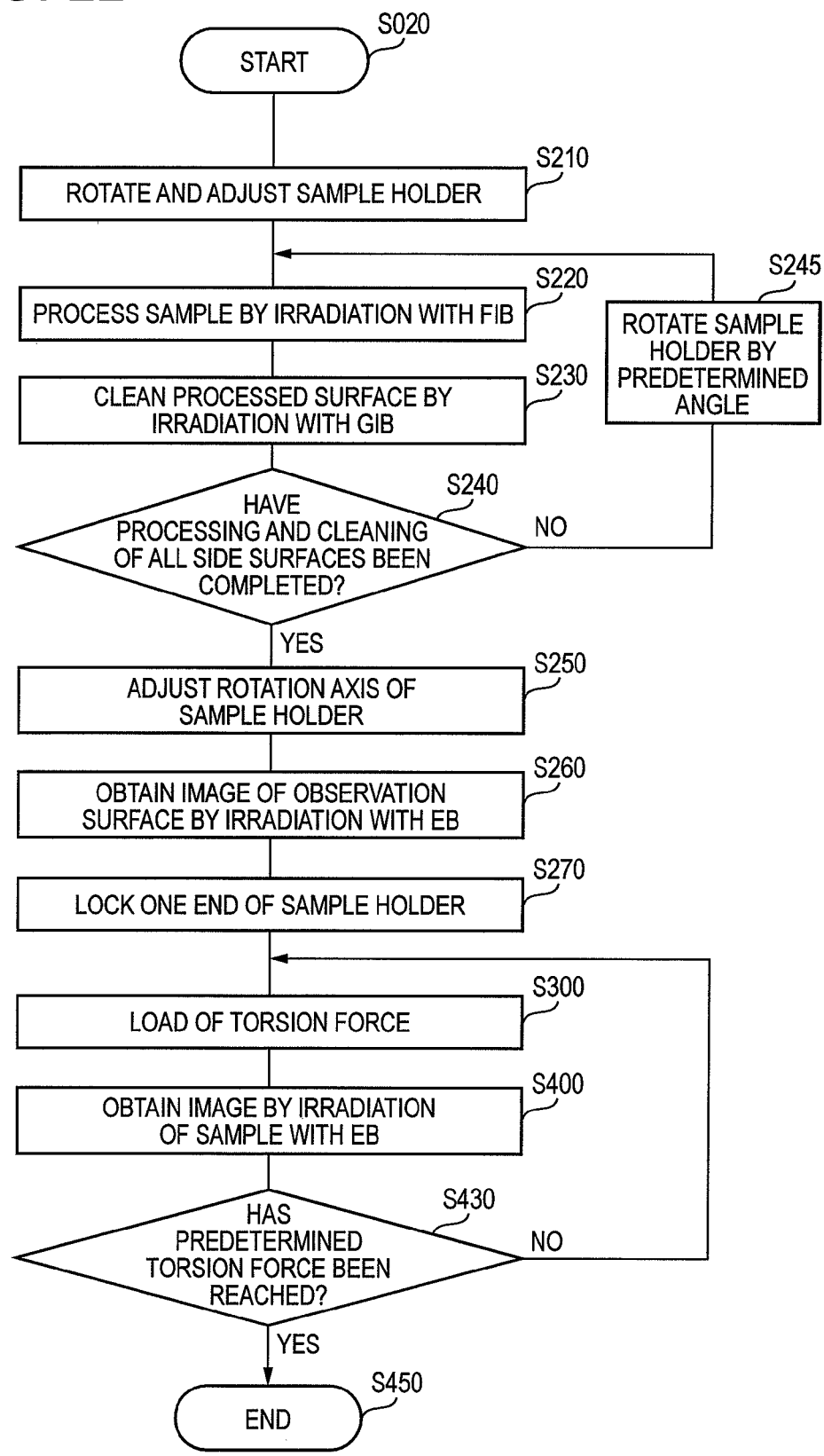
FIG. 22 is an explanatory flowchart of another procedure for evaluating torsion of a sample by the sample processing evaluation apparatus according to the embodiment.

FIG. 22 is an explanatory flowchart of another embodiment of the torsion evaluation procedure. Steps S020, S300, S400, and S450 in FIG. 22 are the same processes as those in the respective steps in FIG. 21.

Step S200 for producing the sample in FIG. 21 is split to Steps S110 to S160 in the flow illustrated in FIG. 22. For the sample holder 106 that is installed on the sample stage 5 of the sample processing evaluation apparatus, the sample stage 5 is moved within an XYZ plane and the sample holder 106 is rotated and adjusted such that a side surface as a torsion evaluation target coincides with an FIB scanning direction (Step S210). Next, the sample 107 is processed by irradiating the specific surface of the sample 107 with the FIB (Step S220). Then, the processing damaged layer generated due to the irradiation with the FIB is removed (cleaned) by irradiating the surface, which has been processed by the irradiation with the FIB, with the GIB (Step S230).

In order to process and clean all the side surfaces of the sample 107, it is determined whether the processing and the cleaning of all the side surfaces have been completed every time the processing and the cleaning of each surface have been completed (Step S240). For the processing of the side surfaces, the rotation axis of the sample holder 106 is rotated by a predetermined angle corresponding to the number of surfaces of the sample 107 (Step S245) if the processing and the cleaning of all the side surface have not been completed (N in Step S240). The predetermined angle is 90° if the sample as the evaluation target has a prism shape, for example. Then, Steps S220 and S230 are repeated. If it is determined in Step S240 that the processing and the cleaning of all the side surfaces have been completed (Y in Step S240), the processing proceeds to the following step. The determination in Step S240 can be made based on the number of surfaces of the sample that is obvious in advance or the rotation angle in Step S245 and the number of times of execution of Step S220 (or S230).

Steps S250 to S270 correspond to a preparation stage for loading the torsion force to the sample 107, and the rotation axis of the sample holder 106 is adjusted such that the focused observation surface of the sample 107 is located at an optimal position for the irradiation with the EB (Step S250). An image is obtained by irradiating the focused sample 107 with the EB before applying the load to the sample 107 (Step S260). Thereafter, one rotation control unit 161 of the sample holder 106 is fixed (locked) (Step S270). Steps S260 and S270 may be performed in the opposite order.

Then, the aforementioned Steps S300 (the loading of the torsion force) and S400 (the image acquisition by irradiating the sample with the EB) are performed. After Step S400, it is determined whether the torsion force applied to the sample 107 has reached torsion force determined in advance or whether the maximum torsion angle has been reached (Step S430). If the torsion force determined in advance has not been reached (N in Step S430), Steps S300 and S400 are repeated in order to further increase the load. If the torsion force determined in advance has been reached in Step S430 (Y in Step S430), or when the maximum torsion angle has been reached, the series of procedure is completed (Step S450). If the sample 107 breaks in Step S300, the processing proceeds to Step S450 after Step S400.

The series of flow from Step S020 to Step S450 illustrated in FIGS. 21 and 22 is performed by causing the FIB control unit 11, the EB control unit 12, the GIB control unit 13, the image formation unit 14, the sample stage control unit 15, the sample holder control unit 60, the control unit 17, and the calculation processing unit 21 in FIG. 1 to sequentially and automatically operate in accordance with a program determined in advance, and torsion of the sample 107 can be automatically evaluated. In addition, the reproduced image can be automatically displayed on the display unit 18.

That is, the FIB control unit 11 controls the FIB to process the sample under conditions such as an acceleration voltage, an FIB diameter, a beam current, and irradiation time determined in advance for processing a position determined in advance by a cutting amount determined in advance. The EB control unit 12 controls the EB to irradiate the surface of the sample under conditions such as an acceleration voltage, an EB diameter, a beam current, an irradiation range, and irradiation time determined in advance. The GIB control unit 13 controls the GIB to irradiate the processed surface of the sample after the processing with the FIB under conditions of an acceleration voltage, a GIB diameter, a beam current, an irradiation range, and irradiation time determined in advance. The sample holder control unit 60 controls the sample holder 106 to rotate the sample 107 at optimal angles for the irradiation with the FIB, the irradiation with the EB, and the irradiation with the GIB at optimal timing. The image formation unit 14 takes an image signal (at least one of a secondary electron signal, a reflected electron signal, a transmission electron signal, an X-ray signal, and the like) obtained by the irradiation with the EB and forms an image of the portion irradiated with the EB. The calculation processing unit 21 accumulates image data formed by the image formation unit 14, edits the image data, and displays the image data on the display unit at timing determined in advance as necessary. The gas gun control unit 20 moves a nozzle to a position determined in advance at a timing determined in advance and controls the type of gas, irradiation time, irradiation timing, stop timing, and the like determined in advance for the gas gun. The control unit 17 may be configured to perform overall control thereof.

Seventh Embodiment

Next, a description will be given of another embodiment of the sample processing evaluation apparatus according to the invention. This embodiment is an example in which a sample is produced and bending of the sample is evaluated in the same place.

Figure 23:
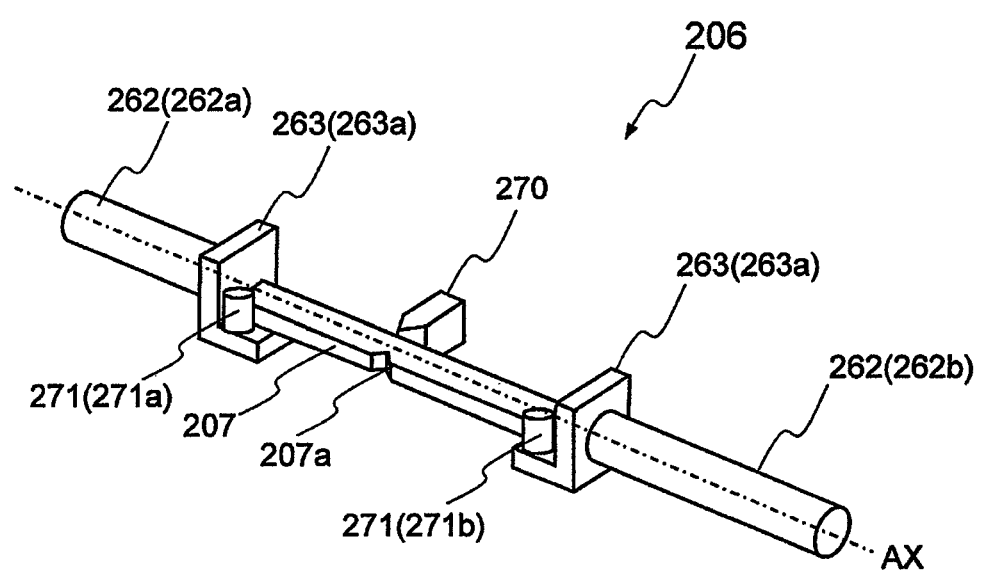
FIG. 23 is a configuration diagram schematically illustrating main parts of a sample processing evaluation apparatus according to another example of the invention.

First, a configuration, operations, and actions of a sample holder 206 that is installed so as to be attachable to and detachable from the sample stage 5 will be described. FIG. 23 illustrates an embodiment of the sample holder 206, and illustration of the rotation control units 161 and the base 164 that are common to those in FIGS. 19 and 20 is omitted.

The sample holder 206 includes a pair of rotation control units that are arranged on a base, a pair of rotation shafts 262 (262*a*, 262*b*), and holding units 263 (263*a*, 263*b*) that hold a sample (sample piece) 207 on the axis of the rotation shafts 262. The holding units 263 also include support poles 271 (271*a*, 271*b*) that support the sample 207. The sample holder 206 can be fixed so as to be attachable to and detachable from the upper surface of the sample stage 5 via the base. Rotation of the pair of rotation shafts 262 can be controlled by the rotation control units. The sample holder 206 includes a load unit 270 that applies a load in a direction vertical to the longitudinal direction of the sample 207, and the load unit 270 is coupled to the rotation shafts 262 via a load control unit (omitted in the drawing). Therefore, it is possible to apply a load to the sample 207 in the same direction even if the sample 207 is rotated. As for bending evaluation according to the embodiment, so-called three-point bending evaluation can be performed by applying a load to the sample from three locations, namely the support poles 271*a* and 271*b* and the load unit 270.

The sample 207 used in this embodiment has a minute prism shape with a size of 5 μm×3 μm×50 μm, for example, and a notch 207*a* may be provided for evaluation as necessary. The vertical direction in FIG. 23 is the FIB irradiation direction, and the notch 207*a* can be processed in the sample 207 with the FIB. Cracking occurs and grows from a tip end of the notch 207*a* by applying the load to the sample 207. The invention is not limited to the notch, and a hole that penetrates through the sample may be processed with the FIB instead of the notch as necessary.

When the load is applied, the tip end of the notch 207*a* is fixed in such a direction that the SEM observation can be performed by rotating the rotation shafts 262 (262*a*, 262*b*). It is possible to observe progress of the cracking with the SEM in multiple directions by rotating the rotation shafts 262 as needed even while the load is applied. If a transmission electron detector (omitted in the drawing) is installed at an opposite direction to the electron beam column with the sample 207 interposed therebetween, and the thickness of the sample is thin enough to transmit electrons, then it is possible to observe how the cracking propagates in the sample. In a case of the aforementioned through-hole, it is also possible to grasp, with the SEM, how cracking occurs from an end of the hole due to the load.

It is possible to observe a breaking surface with the SEM even if the load is continuously applied and the sample finally breaks as long as the sample is held by the base and the sample stage, and to perform microscopic evaluation in a level of crystal particles on the braking surface for factors of the breakage.

With such a configuration, it is possible to apply a bending load to the minute sample, to evaluate bending of the sample, and to observe how the cracking advances in multiple directions with the SEM even during the application of the load. It is also possible to process the sample and to perform processing for correcting the shape of the sample or forming a notch. Furthermore, since the processing and the evaluation can be performed in the same environment (vacuum sample chamber), concerns in relation to material evaluation, such as oxidation of the sample due to the ambient air, can be ignored.

Although the three-point bending was mainly described in the seventh embodiment, it is also possible to evaluate bending of the sample with both ends, to which moment is applied, by fixing the both ends of the sample 207 with the clamps and inclining the clamps at the both ends. The SEM observation and analysis can be performed on the sample during the application of the load in multiple directions by rotating the rotation axis in a loaded state even in this case.

It is possible to evaluate bending of the sample during heating or cooling by installing a heater or a cooler on the holding unit of the sample even in this embodiment.

Details of the aforementioned respective embodiments, such as the sizes of the sample holders 6, 106, and 206 and the method of attaching the samples 7, 107, and 207, are not particularly limited, and optimal configurations can be selected for observation and measurement. Since the sample holders 6, 106, and 206 are attachable to and detachable from the sample stage 5, it is only necessary to select a sample holder suitable for a property evaluation item of the sample and to install the selected sample holder on the sample stage 5.

The detailed configurations of the sample holders 6, 106, and 206 were described in the aforementioned embodiments. However, configurations of the sample holders 6, 106, and 206 are not limited to those in the embodiments. That is, the configurations of the sample holders 6, 106, and 206 are not particularly limited as long as the sample holders 6, 106, and 206 can rotate the sample 7, 107, and 207 about the rotation axis on the sample stage 5. Although it is preferable that the rotation shafts 63*a*, 63*b*, 162*a*, 162*b*, 262*a*, and 262*b*, and the rotation axis AX are substantially parallel with the upper surface of the sample stage 5, the invention is not necessarily limited to such a configuration. In an extreme instance, the sample holders 6, 106, and 206 can be arbitrarily configured as long as the rotation axis AX is not vertical to the sample stage 5.

The invention is not limited to the aforementioned embodiments, and modifications, amendment, and the like can be appropriately made. In addition, materials, shapes, dimensions, numerical values, configurations, numbers, arrangement positions, and the like of the respective components in the aforementioned embodiments are not limited as long as the invention can be achieved.

Furthermore, although examples of the torsion, the bending, heating, and cooling were described as examples of property evaluation in the aforementioned embodiments, the invention is not limited thereto and is applied to compression evaluation performed by compressing the sample in the axial direction and fatigue evaluation performed by repeatedly applying a load. For example, it is possible to evaluate a rotation fatigue property of the sample by continuously rotating the sample 7 for a long period of time by using the sample holder 6B illustrated in FIG. 12. In such a case, it is possible to evaluate configurations and properties by rotating the sample for a long period of time by periodically stopping the rotation and observing the condition of the sample with the SEM or performing composition analysis.

There is a common advantage that it is possible to observe and analysis a minute region in multiple directions in the respective loaded state.

Since the sample processing evaluation apparatus according to the invention can rotate a sample on the sample stage, the sample processing evaluation apparatus can accurately and easily process and observe the entire outer periphery of the sample.

What is claimed is:

1. A sample processing evaluation apparatus comprising:
   a charged particle beam column configured to irradiate at least a sample with a charged particle beam;
   a sample holder configured to hold both ends of the sample; and
   a sample stage on which the sample holder is placed,
   wherein the sample holder is located between the sample stage and the charged particle beam column and is configured to rotate the sample about a rotation axis.

2. The sample processing evaluation apparatus according to claim 1, wherein the sample holder is configured to rotate the sample by 360° about the rotation axis.

3. The sample processing evaluation apparatus according to claim 1, wherein the rotation axis is set so as to be substantially parallel with a surface, on which the sample holder is placed, of the sample stage.

4. The sample processing evaluation apparatus according to claim 1, wherein the sample holder comprises:
   a base that is arranged so as to be attachable to and detachable from the sample stage;
   a rotation shaft that is held by the base in a rotatable manner and is parallel with the rotation axis; and
   a holding unit fixed to the rotation shaft and is configured to directly hold the sample.

5. A sample processing evaluation apparatus comprising:
   a focused ion beam column configured to irradiate a sample with a focused ion beam;
   an electron beam column configured to irradiate the sample with an electron beam coincide with an irradiation position on the sample with the focused ion beam;
   a sample holder configured to hold both ends of the sample; and
   a sample stage on which the sample holder is placed,
   wherein the sample holder is located between the sample stage and the focused ion beam column and is configured to rotate the sample about a rotation axis, the rotation axis being vertical to a plane formed by a focused ion beam irradiation axis of the focused ion beam column and an electron beam irradiation axis of the electron beam column.

6. The sample processing evaluation apparatus according to claim 5, wherein the sample holder is configured to rotate the sample by 360° about the rotation axis.

7. The sample processing evaluation apparatus according to claim 5, wherein the rotation axis is set so as to be substantially parallel with a surface, on which the sample holder is placed, of the sample stage.

8. The sample processing evaluation apparatus according to claim 5, wherein the sample holder comprises:
   a base that is arranged so as to be attachable to and detachable from the sample stage;
   a rotation shaft that is held by the base in a rotatable manner and is parallel with the rotation axis; and
   a holding unit fixed to the rotation shaft and is configured to directly hold the sample.

9. The sample processing evaluation apparatus according to claim 5, further comprising:
   a gas ion beam column configured to irradiate a processed surface, which has been processed with the focused ion beam, with a gas ion beam for cleaning.

10. The sample processing evaluation apparatus according to claim 9, further comprising a control device configured to:
    generate image data of the processed surface from an image signal that is obtained by irradiating the processed surface, which has been cleaned by being irradiated with the gas ion beam, with the electron beam; and
    save the image data formed by the image formation unit.

11. The sample processing evaluation apparatus according to claim 10, wherein the image signal is at least one of a secondary electron signal of secondary electrons, a reflected electron signals of reflected electrons, a fluorescent X-ray signal of a fluorescent X-ray, and a backscattered electron signal of backscattered electrons that are generated from the processed surface by being irradiated with at least one of the focused ion beam, the electron beam, and the gas ion beam.

12. The sample processing evaluation apparatus according to claim 10, wherein the control device is further configured to construct at least one of a stereoscopic image, a developed image, and a three-dimensional image of the sample by using a plurality of obtained image data items.

13. A sample processing evaluation apparatus comprising:
    a charged particle beam column configured to irradiate a sample with a charged particle beam;
    a sample holder configured to fix the sample; and
    a sample stage on which the sample holder is placed,
    wherein the sample holder comprises a load applicator that is mounted on the sample holder between the sample stage and the charged particle beam column and is configured to apply a load to the sample.

14. The sample processing evaluation apparatus according to claim 13,
    wherein the sample holder comprises:
    a base that is arranged so as to be attachable to and detachable from the sample stage;
    a rotation control unit that is arranged on the base;
    a holding unit configured to hold both ends of the sample; and
    a shaft that couples the rotation control unit and the holding unit, and
    wherein the shaft is rotated based on a control signal from the rotation control unit and rotates the sample that is held by the holding unit.

15. The sample processing evaluation apparatus according to claim 13, wherein the load is at least one kind of torsion force, bending force, heating and cooling, and compression force.

16. The sample processing evaluation apparatus according to claim 13, wherein the charged particle beam is at least one of a focused ion beam, an electron beam, and a gas ion beam.

17. The sample processing evaluation apparatus according to claim 13,
   wherein the charged particle beam is an electron beam, and
   wherein the sample processing evaluation apparatus further comprises a detector configured to detect at least one kind of secondary electrons, reflected electrons, and an X-ray generated when the sample is irradiated with the electron beam.

18. The sample processing evaluation apparatus according to claim 14, wherein the holding unit is provided with a heater configured to heat the sample or a cooler configured to cool the sample.

* * * * *